(12) United States Patent
Kobayashi

(10) Patent No.: US 8,176,627 B2
(45) Date of Patent: May 15, 2012

(54) METHOD OF MANUFACTURING WIRING SUBSTRATE AND METHOD OF MANUFACTURING ELECTRONIC COMPONENT DEVICE

(75) Inventor: Kazuhiro Kobayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 1106 days.

(21) Appl. No.: 12/071,008

(22) Filed: Feb. 14, 2008

(65) Prior Publication Data
US 2008/0202661 A1 Aug. 28, 2008

(30) Foreign Application Priority Data
Feb. 28, 2007 (JP) .................. 2007-049362

(51) Int. Cl.
*H05K 3/02* (2006.01)
*H05K 3/10* (2006.01)
(52) U.S. Cl. ............. 29/846; 29/830; 156/248; 174/255
(58) Field of Classification Search .................... 29/830, 29/846–849, 852; 156/247, 248, 289; 174/255, 174/260, 262; 361/748
See application file for complete search history.

(56) References Cited

U.S. PATENT DOCUMENTS

| 7,152,314 B2 | 12/2006 | Shuto et al. | |
| 7,222,421 B2 | 5/2007 | Nakamura | |
| 7,320,173 B2 * | 1/2008 | Lee et al. | 29/846 |
| 7,346,982 B2 * | 3/2008 | Kim et al. | 29/847 |

FOREIGN PATENT DOCUMENTS

| JP | 2004-87701 | 3/2004 |
| JP | 2004-235323 | 8/2004 |
| JP | 2005-236244 | 9/2005 |

* cited by examiner

*Primary Examiner* — Donghai D. Nguyen
(74) *Attorney, Agent, or Firm* — Kratz, Quintos & Hanson, LLP

(57) ABSTRACT

In a method of manufacturing a wiring substrate, first, a structure in which an underlying layer is arranged in a wiring forming area of a temporary substrate and a peelable multi-layer metal foil that is larger in size than the underlying layer is arranged on the underlying layer and is adhered partially to an outer peripheral portion of the wiring forming area, is obtained. The peelable multi-layer metal foil is constructed by temporary adhering a first metal foil and a second metal foil with peelable. Then, a built-up wiring layer is formed on the peelable multi-layer metal foil, and the peelable multi-layer metal foil is separated from the temporary substrate by cutting a portion corresponding to a peripheral portion of the underlying layer, to obtain a wiring member in which the built-up wiring layer is formed on the peelable multi-layer metal foil.

17 Claims, 18 Drawing Sheets

METHOD OF MANUFACTURING WIRING SUBSTRATE AND METHOD OF MANUFACTURING ELECTRONIC COMPONENT DEVICE

CROSS-REFERENCE TO RELATED APPLICATIONS

This application is based on and claims priority of Japanese Patent Application No. 2007-049362 filed on Feb. 28, 2007, the entire contents of which are incorporated herein by reference.

BACKGROUND OF THE INVENTION

1. Field of the Invention

The present invention relates to a method of manufacturing a wiring substrate and a method of manufacturing an electronic component device and, more particularly, a method of manufacturing a wiring substrate applicable to a mounting substrate for an electronic component, and a method of manufacturing an electronic component device applied to mount the electronic component on the wiring substrate.

2. Description of the Related Art

In the prior art, as the wiring substrate on which the electronic component is mounted, such a method has been proposed that a predetermined built-up wiring layer is formed on a temporary substrate with peelable condition and then the built-up wiring layer is separated from the temporary substrate to get the wiring substrate. In Patent Literature 1 (Patent Application Publication (KOKAI) 2005-236244, FIG. 1 to FIG. 6), such a method is set forth that the built-up wiring layer is formed on the resin substrate via the copper foil with carrier having the structure that two sheets of copper foils are adhered via the peelable layer, and then the upper copper foil and the built-up wiring layer are separated by peeling the copper foil with carrier along its boundary from the resin substrate to get the wiring substrate.

Also, in Patent Literature 1 (Patent Application Publication (KOKAI) 2005-236244, FIG. 7 to FIG. 10), such a method is also set forth as another mode that the periphery side of the copper foil is adhered to the resin substrate by the adhesive layer and the built-up wiring layer is formed thereon, and then the copper foil and the built-up wiring layer are separated from the resin substrate by cutting the inner side portion of the adhesive layer of the wiring substrate to get the wiring substrate.

Also, in Patent Literature 2 (Patent Application Publication (KOKAI) 2004-235323), such a method is also set forth that the first metal layer and the second metal layer are laminated to be pasted by the adhesive film on the core substrate such that an outer periphery of the first metal layer is positioned on the inner side than an outer periphery of the second metal layer, and then the built-up wiring layer is formed on the second metal layer, and then the second metal layer and the built-up wiring layer are separated from the first metal layer and the core substrate by cutting the peripheral portion of the first metal layer of the wiring substrate.

Also, in Patent Literature 3 (Patent Application Publication (KOKAI) 2004-87701), such a method is also set forth that the release film whose size is smaller than the carrier plate and the metal base whose size is substantially equal to the carrier plate are pasted onto the carrier plate by the adhesive layer, and then the metal pad is formed on the metal base, and then the metal base is separated from the release film and the carrier plate by cutting the peripheral portion of the release film of the wiring substrate.

However, in above Patent Literatures 1 and 2, rigidity of the built-up wiring layer is weak. Therefore, when the built-up wiring layer is separated from various substrates, in some cases either such built-up wiring layer may be deformed or the wiring or the insulating layer may be damaged. As a result, manufacturing yield and reliability are not completely satisfactory.

SUMMARY OF THE INVENTION

It is an object of the present invention to provide a method of manufacturing a wiring substrate, capable of separating a built-up wiring layer from a temporary substrate with high yield and good reliability, in a manufacturing method in which the wiring substrate is obtained by separating the built-up wiring layer from the temporary substrate, after the built-up wiring layer is formed on the temporary substrate with peelable condition, and to provide a method of manufacturing an electronic component device for mounting the electronic component on the wiring substrate.

The present invention is associated with a method of manufacturing a wiring substrate, which includes the steps of obtaining a structure in which an underlying layer is arranged in a wiring forming area of a temporary substrate, and a peelable multi-layer metal foil that is larger in size than the underlying layer is arranged on the underlying layer and is adhered partially to an outer peripheral portion of the wiring forming area of the temporary substrate, the peelable multi-layer metal foil constructed by temporary adhering a first metal foil and a second metal foil with peelable condition; forming a built-up wiring layer on the peelable multi-layer metal foil; and separating the peelable multi-layer metal foil from the temporary substrate, by cutting a portion of a structure in which the underlying layer, the peelable multi-layer metal foil, and the built-up wiring layer are formed on the temporary substrate, the portion corresponding to a peripheral portion the underlying layer, thereby obtaining a wiring member in which the built-up wiring layer is formed on the peelable multi-layer metal foil.

In one preferred mode of the present invention, the semi-cured prepreg is used as the material of the temporary substrate. The underlying layer (the metal foil, the release film, or the release agent) is arranged in the wiring forming area of the prepreg, and the peelable multi-layer metal foil is arranged on the prepreg via the underlying layer such that the peelable multi-layer metal foil one size larger than the underlying layer contacts the outer peripheral portion of the prepreg on the outside of the wiring forming area. The peelable multi-layer metal foil is constructed in such a way that the first metal foil and the second metal foil are temporarily adhered in a state that they can be peeled mutually.

Then, the prepreg is cured by heating/pressurizing the prepreg, the underlying layer, and the peelable multi-layer metal foil, thereby the temporary substrate is obtained. Also simultaneously, the underlying layer and the peripheral portion of the peelable multi-layer metal foil are adhered to the temporary substrate. At this time, when the underlying layer is formed of the metal foil, both metal foils are brought simply into contact with each other in their overlapping area. In this case, the underlying layer and the peelable multi-layer metal foil may be similarly adhered onto the temporary substrate by the adhesive layer.

Then, a predetermined built-up wiring layer connected to the peelable multi-layer metal foil is formed on the peelable multi-layer metal foil. Then, the portion of the structure, in which the underlying layer, the peelable multi-layer metal foil, and the built-up wiring layer are formed on the temporary substrate, corresponding to the periphery of the underlying layer is cut. Thus, the area where the underlying layer and the peelable multi-layer metal foil are overlapped mutually can be obtained, and the underlying layer and the peelable multi-layer metal foil can be separated easily. In this manner, the wiring member in which the built-up wiring layer is formed on the peelable multi-layer metal foil can be obtained by separating the peelable multi-layer metal foil from the temporary substrate.

In the present invention, the thick peelable multi-layer copper foil having a relatively large rigidity exists in the wiring member that is separated from the temporary substrate. Therefore, when the wiring member is separated from the temporary substrate, the first metal foil acts as the supporting plate of the built-up wiring layer. Hence, when the wiring member is separated from the temporary substrate, such a situation can be prevented that either the built-up wiring layer is deformed or the wiring layer or the interlayer insulating layer is damaged. As a result, the wiring member can be separated from the temporary substrate with high yield and good reliability.

Also, when the temporary substrate is formed of the prepreg, the underlying layer and the peripheral portion of the peelable multi-layer metal foil can be adhered onto the temporary substrate by utilizing an adhering function caused during curing of the prepreg, without the particular provision of the adhesive layer. Therefore, the structure in which the underlying layer and the peelable multi-layer metal foil are adhered onto the temporary substrate can be obtained by the very simple method.

Also, in the preferred mode of the present invention, a film thickness of the first metal foil is set thicker than a film thickness of the second metal foil in the peelable multi-layer metal foil. The peelable multi-layer metal foil may be adhered to the temporary substrate such that the first metal foil is faced to the temporary substrate side, or conversely the peelable multi-layer metal foil may be adhered to the temporary substrate such that the second metal foil is faced to the temporary substrate side. When the peelable multi-layer metal foil may be adhered to the temporary substrate such that the first metal foil is faced to the temporary substrate side, the first metal foil is peeled after the wiring member is separated from the temporary substrate and then the wiring layer connected to the built-up wiring layer is formed by utilizing the exposed second metal foil. For example, the wiring layer of a predetermined film thickness is formed by the semi-additive method utilizing the second metal foil as the seed layer.

In contrast, when the peelable multi-layer metal foil may be adhered to the temporary substrate such that the second metal foil is faced to the temporary substrate side, the second metal foil is peeled after the wiring member is separated from the temporary substrate and then the wiring layer is formed by patterning the exposed first metal foil as it is. In this manner, the flexible-type wiring substrate having no core substrate can be manufactured.

In the wiring substrate of the present invention, the electronic component (the semiconductor chip) is flip-chip connected to either of the uppermost wiring layer and the lowermost wiring layer, and the external connection terminals are provided to the wiring layer on the opposite side. Thus, the electronic component device is completed.

A timing at which the electronic component is mounted may be set after the individual wiring substrates are obtained or after the built-up wiring layer is formed on the temporary substrate. When the electronic component is mounted in a state that the temporary substrate still exists, the structure is hardly influenced by the bowing and thus the conveyance and the handling are made easy. As a result, the electronic component can be mounted with good reliability.

Otherwise, the electronic component may be mounted after the wiring member in which the built-up wiring layer is formed on the peelable multi-layer metal foil is separated from the temporary substrate. In the case of this mode, the peelable multi-layer metal foil acts as the supporting plate of the built-up wiring layer. Therefore, the structure is difficult to be influenced by the bowing rather than the case where the electronic component is mounted in a state that the first metal foil of the peelable multi-layer metal foil does not exist, and the electronic component can be mounted with good reliability.

As the preferable method applied when the electronic component is be mounted after the built-up wiring layer is formed on the temporary substrate or after the wiring member is separated from the temporary substrate (before the peelable multi-layer metal foil is removed), the connection electrodes should be provided to the lowermost side of the built-up wiring layer which is formed on the peelable multi-layer metal foil, and then the connection electrodes should be exposed by removing the peelable multi-layer metal foil after the wiring member on which the electronic component is mounted is separated from the temporary substrate.

As described above, according to the present invention, the wiring substrate having no core substrate can be manufactured without any trouble.

DETAILED DESCRIPTION OF THE PREFERRED EMBODIMENTS

Embodiments of the present invention will be explained with reference to the accompanying drawings hereinafter.

First Embodiment

Figure 1A:
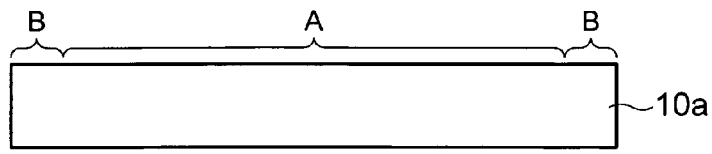
FIGS. 1A to 1N are sectional views (partially, plan views) showing a method of manufacturing a wiring substrate according to a first embodiment of the present invention.
Figure 1B:
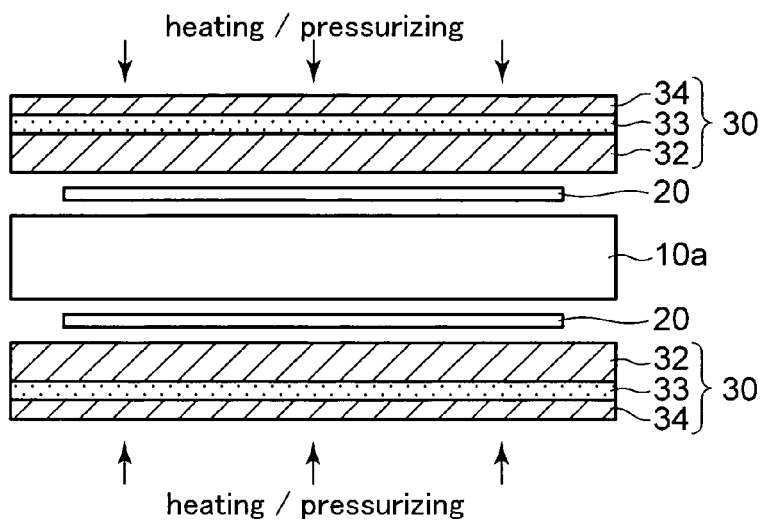
Figure 1C:
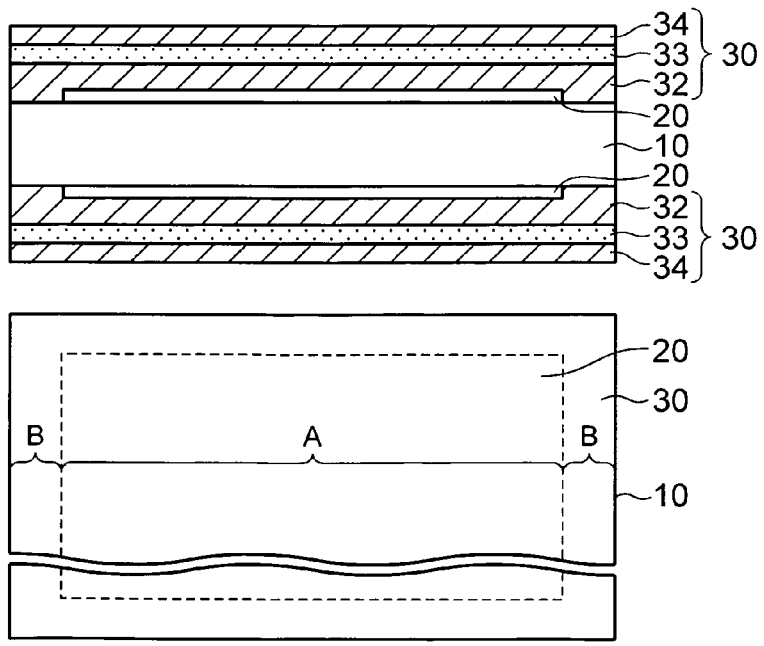
Figure 1D:
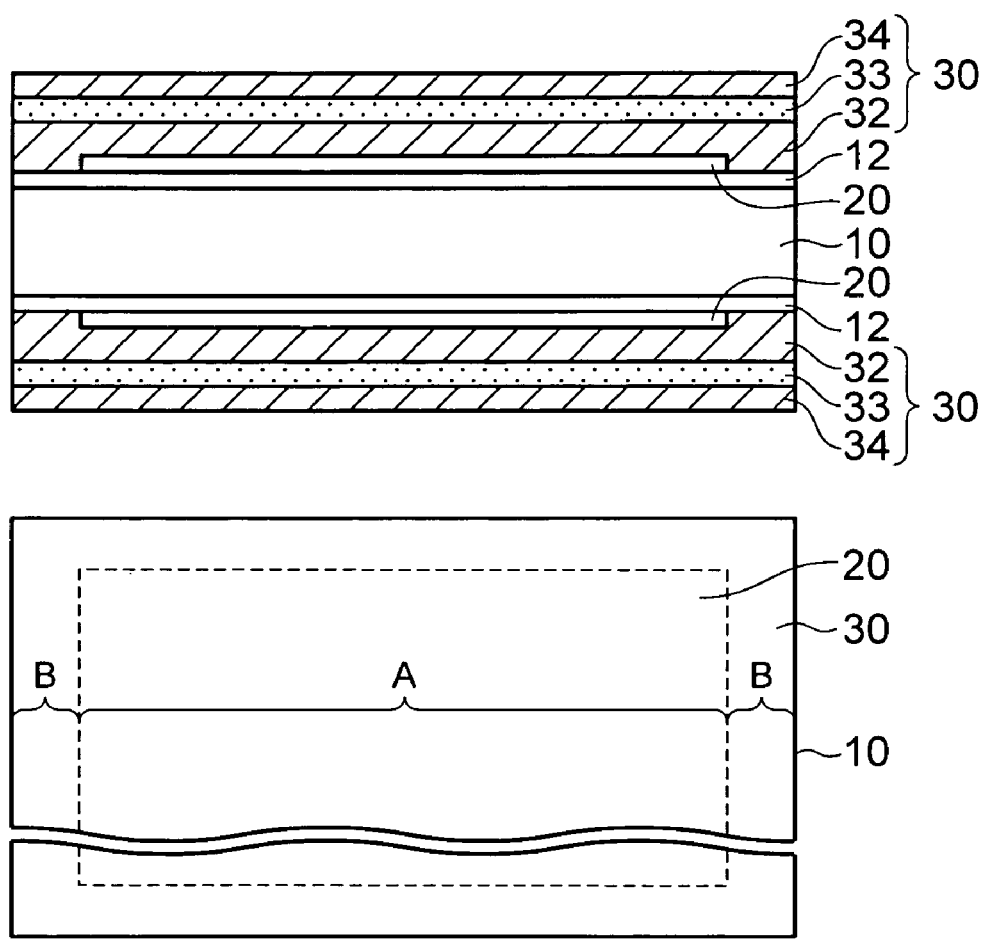
Figure 1E:
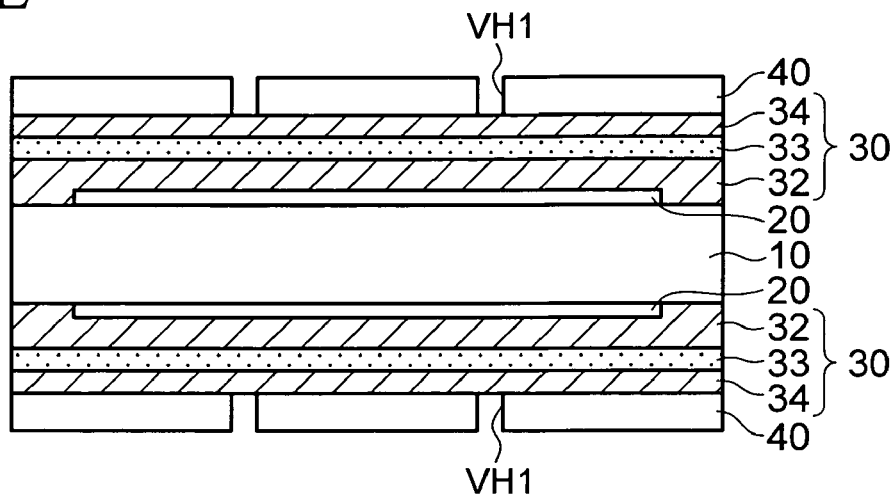
Figure 1F:
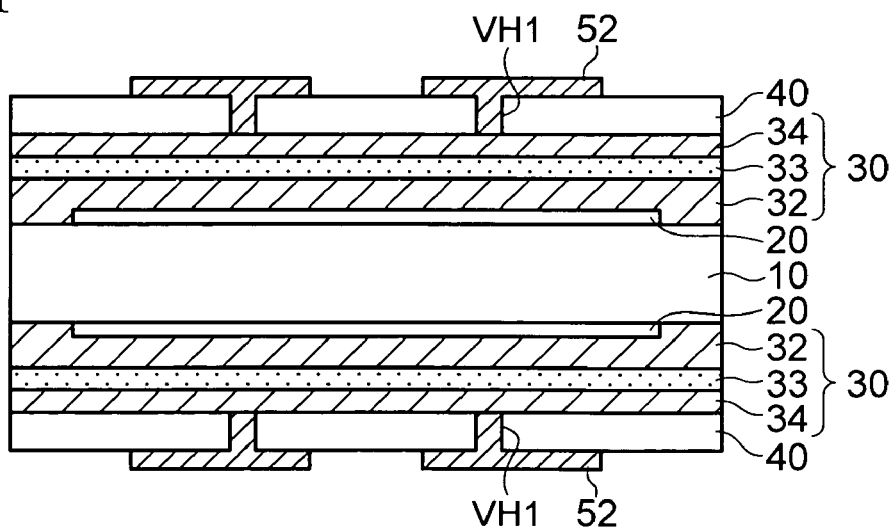
Figure 1G:
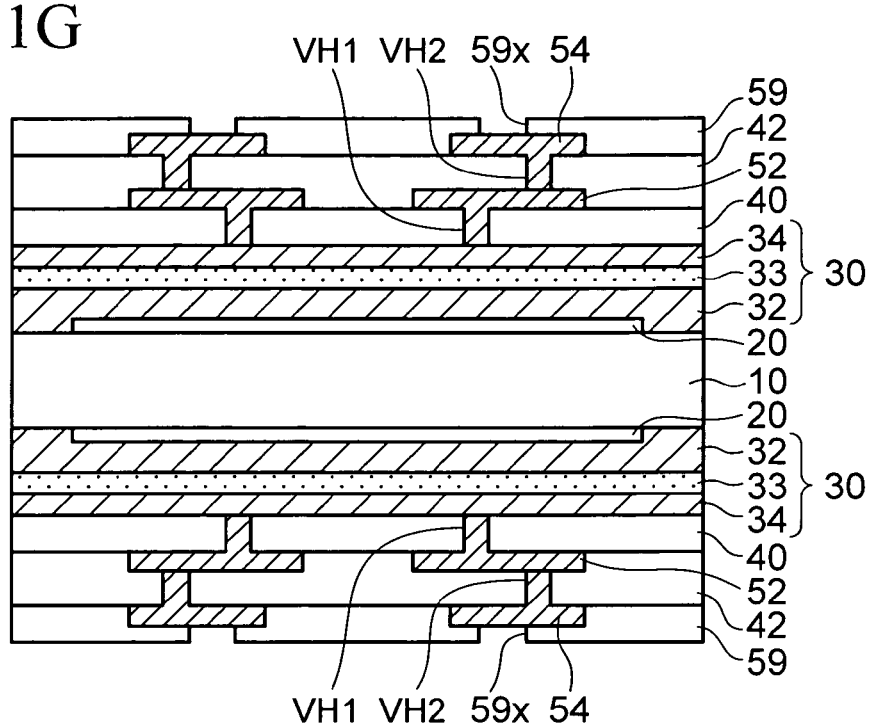
Figure 1H:
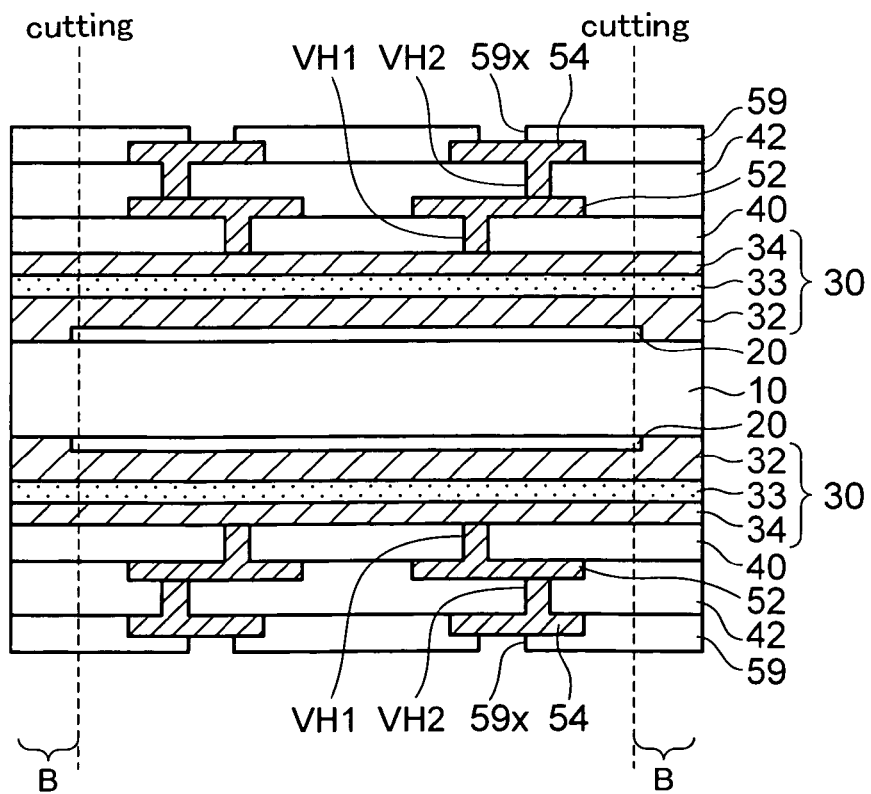
Figure 1I:
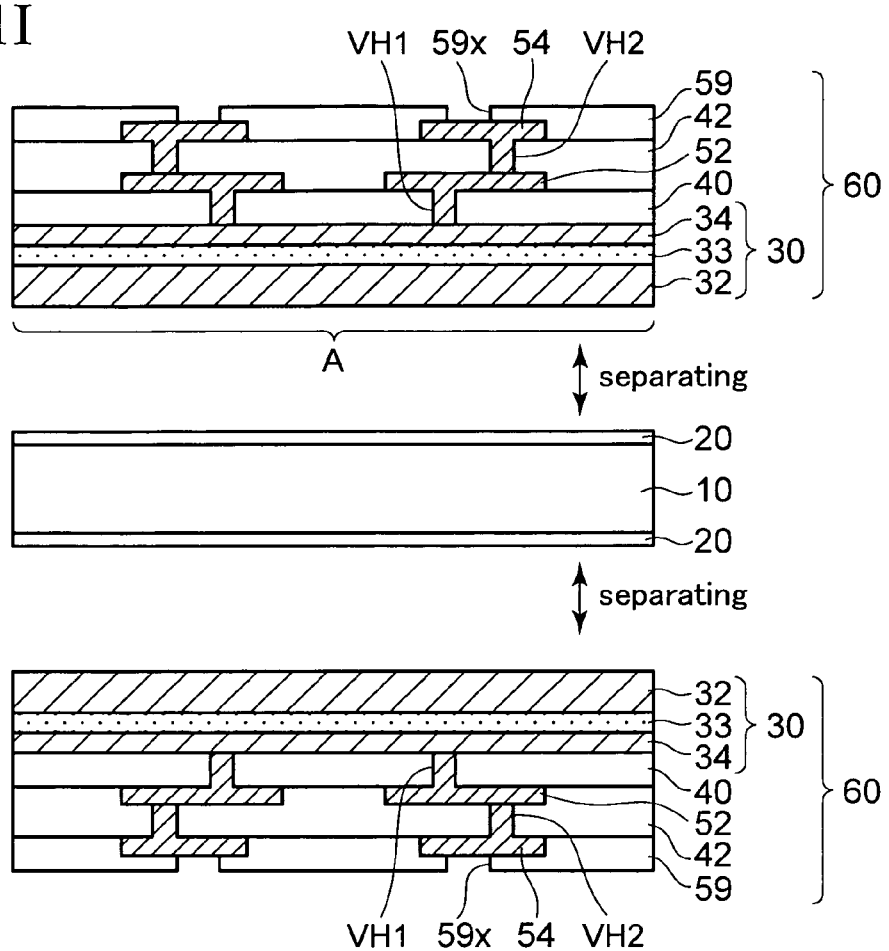
Figure 1J:
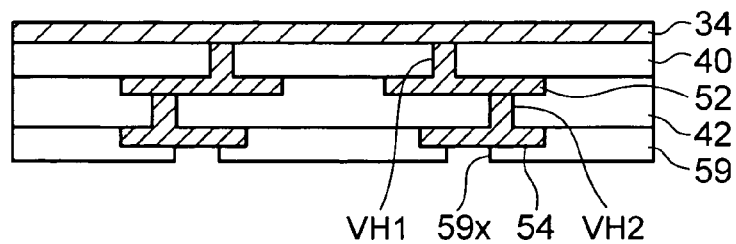
Figure 1K:
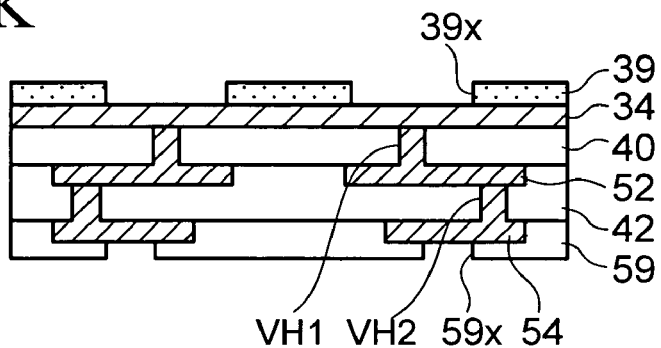
Figure 1L:
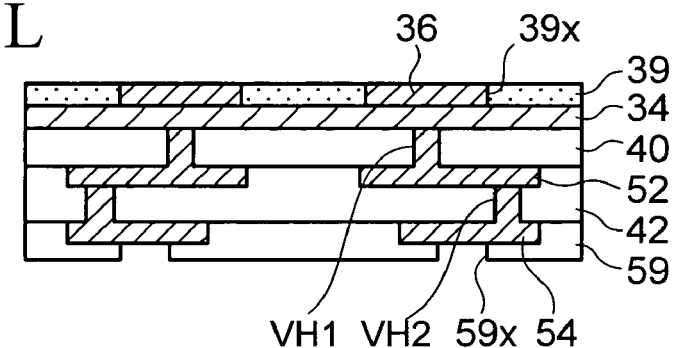
Figure 1M:
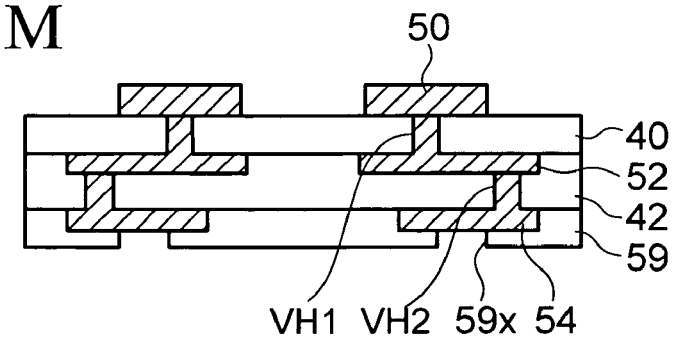
Figure 1N:
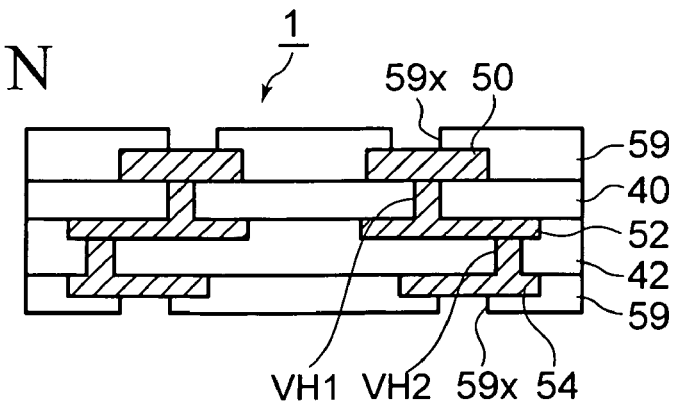
Figure 4:
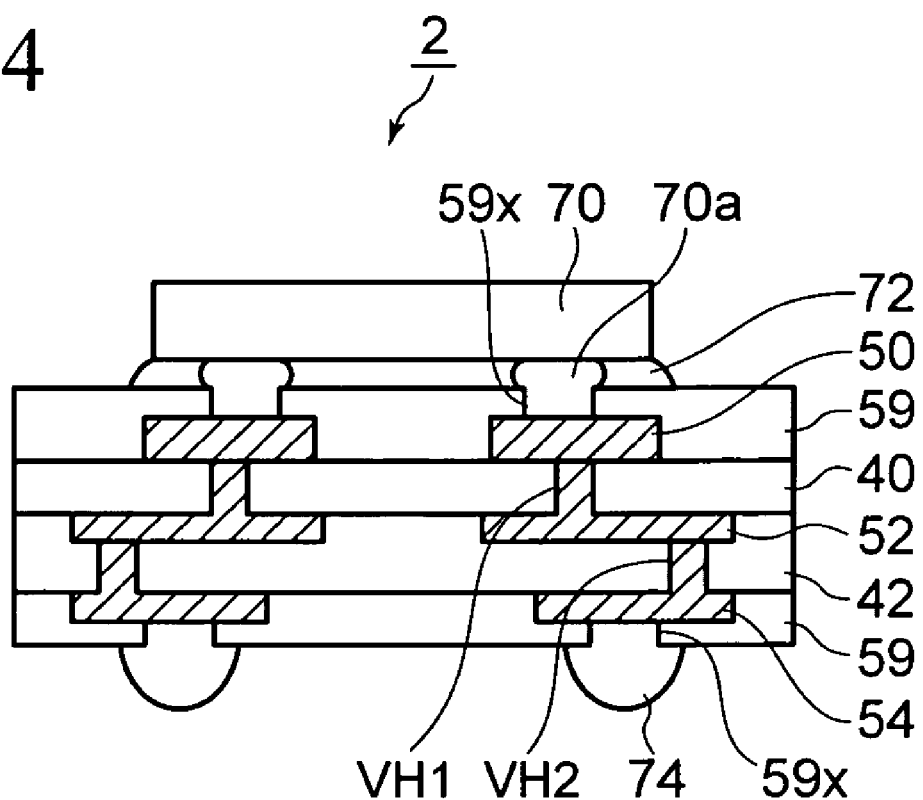
FIG. 4 is a sectional view showing an electronic component device according to the first embodiment of the present invention.

FIGS. 1A to 1N are sectional views (partially, plan views) showing a method of manufacturing a wiring substrate according to a first embodiment of the present invention, and FIG. 4 is a sectional view showing an electronic component device according to the first embodiment of the present invention.

In the method of manufacturing the wiring substrate according to the present embodiment, as shown in FIG. 1A, first, a prepreg 10a formed of glass cloth (woven fabric), glass nonwoven fabric, aramid fiber, or the like that is impregnated with a resin such as an epoxy resin, or the like is prepared. The prepreg 10a that is in a B-stage (semi-cured state) is used.

A wiring forming area A and an outer peripheral portion B are defined on both surface sides of the prepreg 10a respectively. A single wiring forming area A may be defined on both surface sides of the prepreg 10a, or plural wiring forming areas A may be defined.

Then, as shown in FIG. 1B, an underlying layer 20 and a peelable multi-layer copper foil 30 (peelable multi-layer metal foil) are prepared. As the underlying layer 20, a metal foil such as a copper foil, or the like, a release film, or a release agent is used. As the release film, a polyester or PET (polyethylene terephthalate) film on which a thin fluororesin (ETFE) layer is laminated, or a polyester or PET film to which a silicone releasing process is applied is used. Also, as the release agent, a silicone-based release agent or a fluorine-based release agent is used.

The peelable multi-layer copper foil 30 is constructed by pasting a second copper foil 34 whose film thickness is 1 to 10 μm (preferably 3 to 5 μm) on a first copper foil 32 whose film thickness is 10 to 100 μm (preferably 30 to 50 μm) via a peelable layer (adhesive layer) 33. In the present embodiment, the peelable multi-layer copper foil 30 in which a film thickness of the first copper foil 32 is set thicker than a film thickness of the second copper foil 34 is illustrated. But a multi-layer copper foil in which a film thickness of the first copper foil 32 is set thinner than a film thickness of the second copper foil 34 or a multi-layer copper foil in which a film thickness of the first copper foil 32 is set equal to a film thickness of the second copper foil 34 may be used.

In the peelable multi-layer copper foil 30, either of the first copper foil 32 and the second copper foil 34 can be peeled easily by a function of the peelable layer 33, and both foils are temporarily adhered mutually. The first copper foil 32 functions as the supporting plate that makes the handling of the second copper foil 34 as a thin film easy and supports the built-up wiring layer described later. In this case, the copper foil is shown as the peelable multi-layer metal foil. But various metal layers can be used if these layers can be utilized as the wiring layer.

The underlying layer 20 is set equal in size to the wiring forming area A of the prepreg 10a. Also, the peelable multi-layer copper foil 30 has a size to cover the wiring forming area A and the outer peripheral portion B of the prepreg 10a, and is set size one size larger than the underlying layer 20.

Then, the underlying layer 20 and the peelable multi-layer copper foil 30 are arranged sequentially from the bottom on both surface sides of the prepreg 10a respectively. In the present embodiment, the peelable multi-layer copper foil 30 is arranged such that the first copper foil 32 is positioned on the prepreg 10a side. The underlying layer 20 is arranged to correspond to the wiring forming area A on the prepreg 10a. The peelable multi-layer copper foil 30 is arranged to overlap with the underlying layer 20 such that its peripheral portion contacts the outer peripheral portion B of the prepreg 10a. Then, the prepreg 10a, the underlying layer 20 and the peelable multi-layer copper foil 30 are heated/pressurized at a temperature of 190 to 200° C. in a vacuum atmosphere from both surface sides.

Thus, as shown in FIG. 1C, a temporary substrate 10 made of a glass epoxy resin, or the like is obtained when the prepreg 10a is cured. Also, the underlying layer 20 and the peelable multi-layer copper foil 30 are adhered to both surface of the temporary substrate 10 with the curing of the prepreg 10a. The whole surface of the underlying layer 20 is adhered to the wiring forming area A of the temporary substrate 10, and the peripheral portion of the peelable multi-layer copper foil 30 is adhered partially to the outer peripheral portion B of the temporary substrate 10. The underlying layer 20 and the peelable multi-layer copper foil 30 are simply brought into contact with each other in their overlapping area, so that the underlying layer 20 and the peelable multi-layer copper foil 30 can be separated easily in such area, as described later.

In this case, when the release agent is used as the underlying layer 20, the release agent mentioned above is coated or sprayed onto the area of the lower surface of the peelable multi-layer copper foil 30, the area on which the underlying layer 20 is arranged, and then the peelable multi-layer copper foil 30 is arranged on the prepreg 10a via the release agent and is adhered by the heating/pressurizing them. Thus, the peelable multi-layer copper foil 30 and the temporary substrate 10 can be easily separated in the area where the release agent (the underlying layer 20) is provided.

In this manner, in the present embodiment, by arranging the underlying layer 20 and the peelable multi-layer copper foil 30 on the prepreg 10a and then heating/pressurizing them, the structure in which the underlying layer 20 and the peelable multi-layer copper foil 30 are adhered to the temporary substrate 10 can be obtained although the adhesive layer is not particularly used. As a result, a cost of the adhesive material can be cut, the step of adhering the underlying layer 20 and the peelable multi-layer copper foil 30 to the temporary substrate 10 can be simplified, and a reduction of manufacturing cost can achieved.

Here, when the adhesive layer may be used, the underlying layer 20 and the peripheral portions of the peelable multi-layer copper foil 30 may be adhered to the temporary substrate 10 via an adhesive layer 12, as shown in FIG. 1D. In this case, there is no need to use the prepreg as the temporary substrate 10, and various materials such as a cured resin, and the like can be used. In the structure in FIG. 1D, like FIG. 1C, the underlying layer 20 and the peelable multi-layer copper foil 30 are simply brought into contact with each other in their overlapping area, so that the underlying layer 20 and the peelable multi-layer copper foil 30 can be separated easily in such area Then, as shown in FIG. 1E, for example, a resin film made of epoxy, polyimide, or the like is pasted on the peelable multi-layer copper foil 30 on both surface sides of the temporary substrate 10 respectively. Thus, a first interlayer insulating layer 40 is formed over both surface sides of the temporary substrate 10 respectively. Then, the first interlayer insulating layer 40 on both surface sides of the temporary substrate 10 is processed by the laser, the dry etching, or the like. Thus, first via holes VH1 each reaching the peelable multi-layer copper foil 30 are formed.

Then, as shown in FIG. 1F, second wiring layers 52 connected to the second copper foil 34 of the peelable multi-layer copper foil 30 via the first via hole VH1 are formed on the first interlayer insulating layer 40. As described later, a first wiring layer arranged under the second wiring layer 52 is formed by utilizing a part of the second copper foil 34 of the peelable multi-layer copper foil 30 in later steps.

The second wiring layers 52 are formed by the semi-additive method, for example. In more detail, a seed layer (not shown) is formed in the first via holes VH1 and on the first interlayer insulating layer 40, and then a resist (not shown) in which openings are formed in areas where the second wiring layers 52 are formed is formed. Then, a metal pattern layer (not shown) is formed in the opening portions in the resist by the electroplating using the seed layer as a plating power feeding layer. Then, the resist is removed, and then the seed layer is etched by using the metal pattern layer as a mask. Thus, the second wiring layers 52 made of copper, or the like are formed.

Here, as the method of forming respective wiring layers of the present embodiment, various wiring forming methods such as the subtractive method, and the like can be employed in addition to the semi-additive method.

Then, as shown in FIG. 1G, a second interlayer insulating layer 42 in which second via holes VH2 are provided on the second wiring layers 52 is formed on both surface sides of the temporary substrate 10 respectively by repeating the similar steps. Then, third wiring layers 54 each connected to the second wiring layer 52 via the second via hole VH2 are formed on the second interlayer insulating layer 42 on both surface sides of the temporary substrate 10 respectively.

Then, a solder resist 59 in which opening portions 59x are provided on connection portions of the third wiring layers 54 is formed on the second interlayer insulating layer 42 on both surface sides of the temporary substrate 10 respectively. Then, a Ni layer and an Au layer are formed sequentially from the bottom by the plating on the third wiring layers 54 in the opening portions 59x of the solder resist 59 respectively, thereby a contact layer (not shown) is formed.

In this manner, a predetermined built-up wiring layer is formed on the peelable multi-layer copper foil 30 on both surface sides of the temporary substrate 10 respectively. In the above example, the two-layered built-up wiring layer (the second and third wiring layers 52, 54) is formed on the peelable multi-layer copper foil 30. But an n-layered (n is an integral number of 1 or more) built-up wiring layer may be formed. Also, the built-up wiring layer may be formed only on one surface of the temporary substrate 10.

As described above, in the present embodiment, the underlying layer 20 and the peelable multi-layer copper foil 30 are merely brought to contact with each other in their overlapping area. Therefore, when the built-up wiring layer is formed on the peelable multi-layer copper foil 30, in the case that respective coefficients of thermal expansion of the temporary substrate 10 and the built-up wiring layer are different largely, in some cases cockles are caused in the built-up wiring layer, because degree of thermal expansion is different between both sides.

From such aspect, preferably the substrate (the prepreg) made of the glass nonwoven fabric epoxy resin substrate, or the like that is impregnated with a resin should be used as the temporary substrate 10. A coefficient of thermal expansion of the glass nonwoven fabric epoxy resin substrate is 30 to 50 ppm/° C., and is similar to an average coefficient of thermal expansion (20 to 50 ppm/° C.) of the built-up wiring layer. A coefficient of thermal expansion of the wiring layer (Cu) of the built-up wiring layer is about 18 ppm/° C., and a coefficient of thermal expansion of the insulating layer (resin) is 50 to 60 ppm/° C.

Under such conditions, the temporary substrate 10 and the built-up wiring layer thermally expand to the same extent even if a heat is applied in the manufacturing steps. Therefore, generation of the cockles in the built-up wiring layer can be prevented. As a result, manufacturing yield and reliability of the built-up wiring layer can be improved.

Then, as shown in FIG. 1H, the outer peripheral portion B containing the peripheral portion of the peelable multi-layer copper foil 30 is removed by cutting the portion of the structure in FIG. 1G corresponding to the periphery of the underlying layer 20. Hence, as shown in FIG. 1I, the wiring forming area A where the underlying layer 20 and the peelable multi-layer copper foil 30 simply contact mutually can be obtained, and the peelable multi-layer copper foil 30 and the underlying layer 20 can be separated easily.

In this manner, by separating the underlying layer 20 and the peelable multi-layer copper foil 30, a wiring member 60 composed of the peelable multi-layer copper foil 30 and the built-up wiring layer formed on this peelable multi-layer copper foil 30 is obtained from both surface sides of the temporary substrate 10 respectively. When a plurality of wiring forming areas A are defined on the temporary substrate 10, a plurality of wiring members 60 can be obtained individually from both surface sides of the temporary substrate 10 respectively.

Unlike the present embodiment, when the wiring member to be separated from the temporary substrate 10 is composed of a thin copper foil and a built-up wiring layer formed on this thin copper foil, rigidity of the wiring member itself is weak. Therefore, when the wiring member is separated from the temporary substrate 10, sometimes either such wiring member may be deformed, or the wiring layer or the interlayer insulating layer may be damaged. As a result, in some cases satisfactory manufacturing yield and reliability cannot be achieved.

However, in the present embodiment, the peelable multi-layer copper foil 30 containing the first copper foil 32 whose film thickness is thick to have a relatively large rigidity exists in the wiring member 60 that is separated from the temporary substrate 10. Therefore, the peelable multi-layer copper foil 30 acts as the supporting plate upon separating the wiring member 60 from the temporary substrate 10. As a result, when the wiring member 60 is separated from the temporary substrate 10, such a situation can be prevented that either the wiring member 60 is deformed, or the wiring layer or the interlayer insulating layer is damaged.

Then, as shown in FIG. 1J, the first copper foil 32 as well as the peelable layer 33 is peeled from the peelable multi-layer copper foil 30 of the wiring member 60. Thus, the second copper foil 34 connected to the second wiring layer 52 is exposed on an outer surface of the wiring member 60.

Then, as shown in FIG. 1K, a plating resist 39 in which opening portions 39x are provided in the area where the first wiring layer is formed is formed on the exposed second copper foil 34. Then, as shown in FIG. 1L, a metal pattern layer 36 is formed in the opening portions 39x of the plating resist 39 by the electroplating utilizing the second copper foil 34 as the plating power feeding path. As the metal pattern layer 36, for example, a copper plating layer is used.

Then, as shown in FIG. 1M, the plating resist 39 is removed, and then the second copper foil 34 is removed by the etching using the metal pattern layer 36 as a mask. Thus, a first wiring layer 50 connected to the second wiring layer 52 is formed on the first interlayer insulating layer 40. In FIG. 1M, the first wiring layer 50 is illustrated as a single layer, but is composed of the second copper foil 34 and the metal pattern layer 36.

Then, as shown in FIG. 1N, the solder resist 59 in which the opening portions 59x are provided on connection portions of the first wiring layers 50 is formed. Then, a Ni layer and an Au layer are formed sequentially from the bottom by the plating on the first wiring layers 50 in the opening portions 59x in the solder resist 59 respectively, thereby a contact layer (not shown) is formed.

With the above, a wiring substrate 1 of the first embodiment is manufactured.

In the preferred mode of the present embodiment, a plurality of wiring forming areas A are defined on both surface sides of the temporary substrate 10 respectively, and the underlying layer 20 is arranged integrally in the block area composed of a plurality of wiring forming areas A. In this condition, the peripheral edge side of the peelable multi-layer copper foil 30 is adhered partially to the outermost peripheral portion of the block area. Then, the built-up wiring layer is formed in these wiring forming areas A respectively. Then, the first copper foil 32 is removed from the wiring member 60 which is obtained by cutting the portion corresponding to the periphery of the underlying layer 20 of this structure, and then after the first wiring layers 50 are formed, the structure is divided into individual wiring substrates.

In this case, when there is no need to form the first wiring layers 50, the second wiring layers 52 exposed from the first via holes VH1 by removing the second copper foil 34 from the wiring member 60 may be used as the land.

Figure 2A:
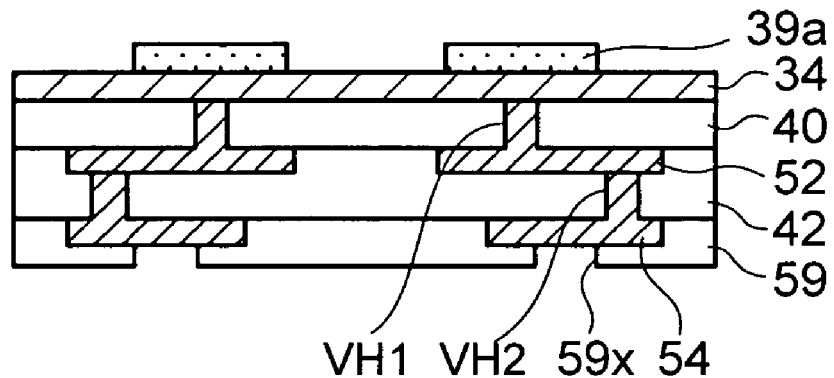
FIGS. 2A to 2C are sectional views showing another method of forming a first wiring layer in the method of manufacturing the wiring substrate according to the first embodiment of the present invention.
Figure 2B:
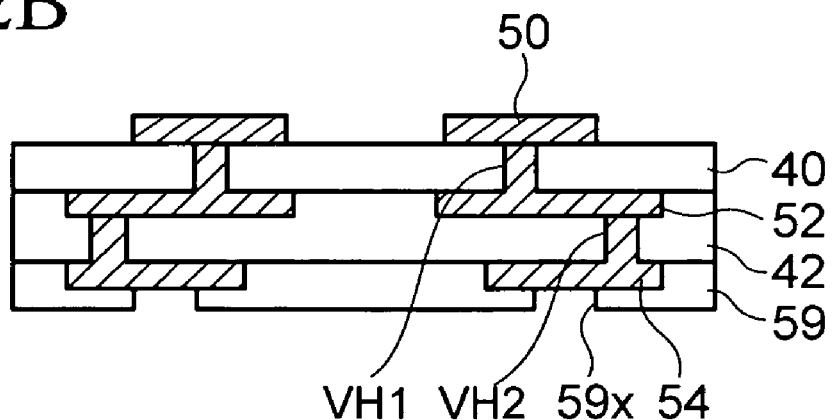
Figure 2C:
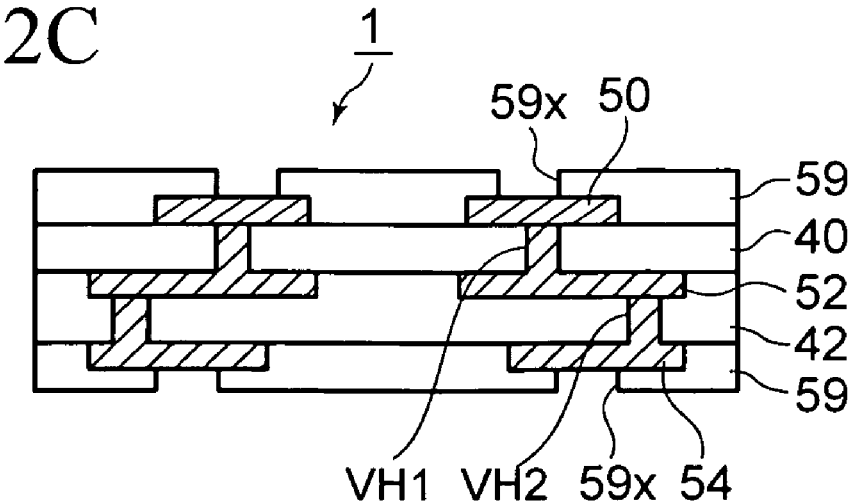

Also, when the second copper foil 34 is utilized as it is as the first wiring layer 50, the first wiring layer 50 may be formed by patterning the second copper foil 34. That is, as shown in FIG. 2A, first, an etching resist 39a is patterned on the second copper foil 34 after the step in FIG. 1J. Then, as shown in FIG. 2B, the first wiring layers 50 are obtained by etching the second copper foil 34 while using the etching resist 39a as a mask. Then, the etching resist 39a is removed. Then, as shown in FIG. 2C, the solder resist 59 in which the opening portions 59x are provided on the connection portions of the first wiring layer 50 is formed, and then a contact layer (not shown) is formed on the first wiring layer 50 in the opening portions 59x.

Figure 3A:
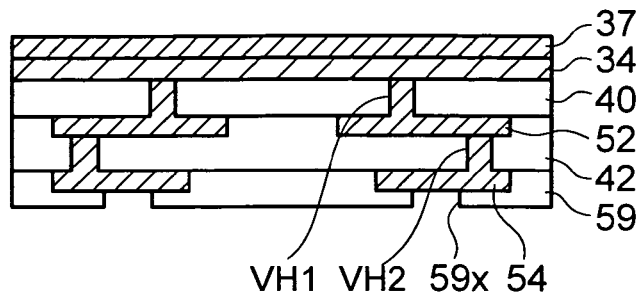
FIGS. 3A to 3D are sectional views showing still another method of forming the first wiring layer in the method of manufacturing the wiring substrate according to the first embodiment of the present invention.
Figure 3B:
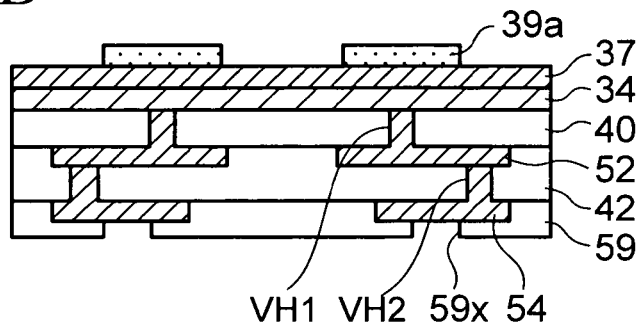

Also, a copper plating layer may be formed further on the second copper foil 34, and then the first wiring layer 50 may be formed by patterning the copper plating layer and the second copper foil 34. That is, as shown in FIG. 3A, first, a metal plating layer 37 formed of copper having any film thickness, or the like is formed on the second copper foil 34 by the electroplating after the step in FIG. 1J. Then, as shown in FIG. 3B, the etching resist 39a is patterned on the metal plating layer 37.

Figure 3C:
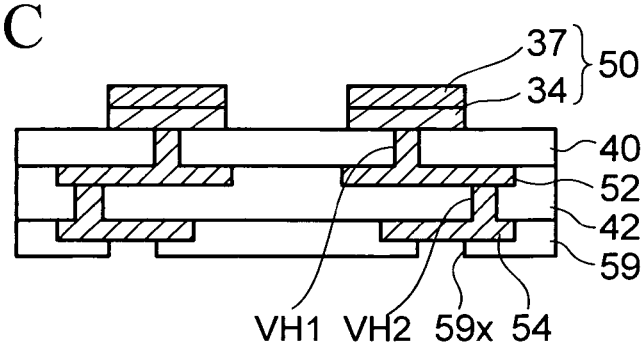
Figure 3D:
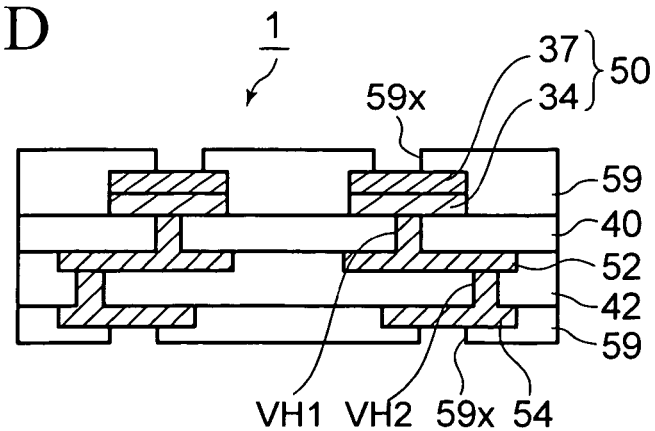

Then, as shown in FIG. 3C, the metal plating layer 37 and the second copper foil 34 are etched by using the etching resist 39a as a mask, and then the etching resist 39a is removed. Thus, the first wiring layer 50 composed of the second copper foil 34 and the metal plating layer 37 is obtained. Then, as shown in FIG. 3D, the solder resist 59 in which the opening portions 59x are provided on the connection portions of the first wiring layers 50 is formed, and then a contact layer (not shown) is formed on the first wiring layer 50 in the opening portions 59x.

In the case of this mode, when a film thickness of the second copper foil 34 applied as the wiring layer is thin, a desired film thickness can be set by forming additionally the metal plating layer 37.

An electronic component device constructed by mounting an electronic component on the wiring substrate according to the present embodiment is shown in FIG. 4. As shown in FIG. 4, in an electronic component device 2 of the present embodiment, bumps 70a of a semiconductor chip 70 are flip-chip connected to the connection portions of the first wiring layers 50 over the above wiring substrate 1. An underfill resin 72 is filled in a clearance between the wiring substrate 1 and the semiconductor chip 70.

Also, external connection terminals 74 are provided by mounting a solder ball, or the like on the connection portions of the first wiring layers 50 under the wiring substrate 1. The third wiring layer 54 may be used as the external connection terminals without the provision of the external connection terminals 74. The semiconductor chip (LSI chip) is illustrated as the electronic component, but a passive component such as a capacitor chip may be mounted.

In this case, conversely, the external connection terminals 74 may be provided to the connection portions of the first wiring layers 50 over the wiring substrate 1 and the semiconductor chip 70 may be flip-chip connected to the connection portions of the third wiring layers 54 under the wiring substrate 1. Otherwise, the semiconductor chip 70 may be flip-chip connected to the first and third wiring layers 50, 54 on both surface sides of the wiring substrate 1 respectively, and the external connection terminals 74 whose height is higher than a thickness of the semiconductor chip 70 may be provided to the wiring layer of one side.

As described above, in the method of manufacturing the wiring substrate of the present embodiment, the underlying layer 20 and the peelable multi-layer copper foil 30 whose size is larger than this underlying layer are arranged/stacked on both surface sides of the prepreg 10a respectively, and the prepreg 10a is cured by the heating/pressurizing such that the temporary substrate 10 is formed and also the whole surface of the underlying layer 20 and the outer peripheral portion of the peelable multi-layer copper foil 30 are adhered to the temporary substrate 10.

Then, the built-up wiring layer is formed on the peelable multi-layer copper foil 30. Then, the underlying layer 20 and the peelable multi-layer copper foil 30 are separated mutually by cutting the portion of this structure corresponding to the periphery of the underlying layer 20. Accordingly, the wiring member 60 composed of the peelable multi-layer copper foil 30 and the built-up wiring layer formed thereon is obtained from both surface sides of the temporary substrate 10 respectively.

At this time, the peelable multi-layer copper foil 30 containing the first copper foil 32 acting as the supporting plate exists in the wiring member 60. Therefore, the wiring member 60 can be separated from the temporary substrate 10 with good reliability and high yield without any trouble occurring in the wiring member 60.

In addition, in the present embodiment, the prepreg 10a having an adhering function is used as the material of the temporary substrate 10. Therefore, the step of adhering the underlying layer 20 and the peelable multi-layer copper foil 30 can be facilitated and a reduction of manufacturing cost can be achieved.

Second Embodiment

FIGS. 5A to 5I are sectional views showing a method of manufacturing a wiring substrate according to a second embodiment of the present invention. A feature of the second embodiment resides in that the peelable multi-layer copper foil 30 is arranged on the temporary substrate in such a state that the peelable multi-layer copper foil 30 used in the first embodiment is reversed up and down, and the wiring member is separated from the temporary substrate, and the second copper foil is removed, and the remaining first copper foil is patterned and utilized as the wiring layer. In the second embodiment, detailed explanation of the same steps and the same elements as those in the first embodiment will be omitted herein.

Figure 5A:
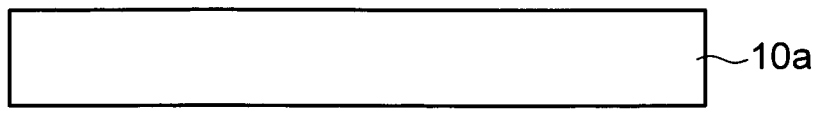
FIGS. 5A to 5I are sectional views (partially, plan views) showing a method of manufacturing a wiring substrate according to a second embodiment of the present invention.
Figure 5B:
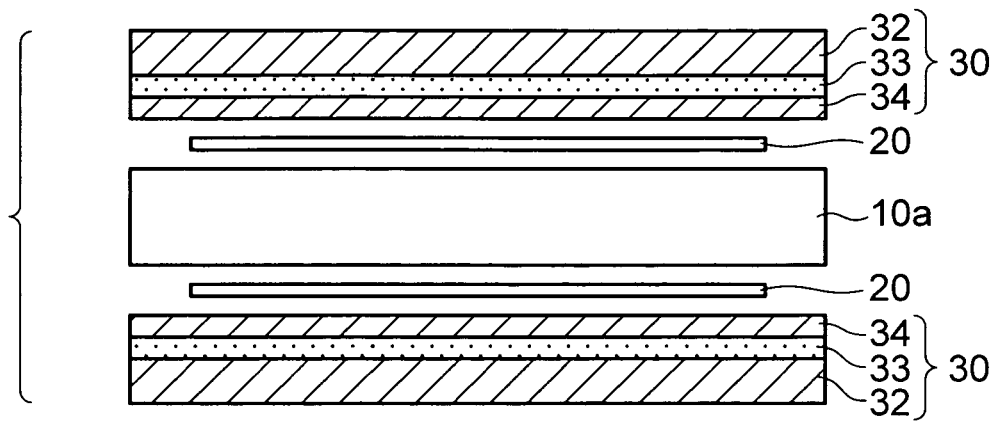

As shown in FIG. 5A, first, the prepreg 10a similar to the first embodiment is prepared. Then, as shown in FIG. 5B, like the first embodiment, the underlying layer 20 and the peelable multi-layer copper foil 30 are arranged on both surface sides of the prepreg 10a sequentially from the lower side. In the second embodiment, the peelable multi-layer copper foil 30 is arranged to be reversed up and down from the first embodiment, and in the upper surface side of the prepreg 10a, the second copper foil 34 is arranged to lower side and the first copper foil 32 is arranged to upper side. That is, the peelable multi-layer copper foil 30 is arranged such that the second copper foil 34 as the thin film side is positioned on the prepreg 10a side.

Figure 5C:
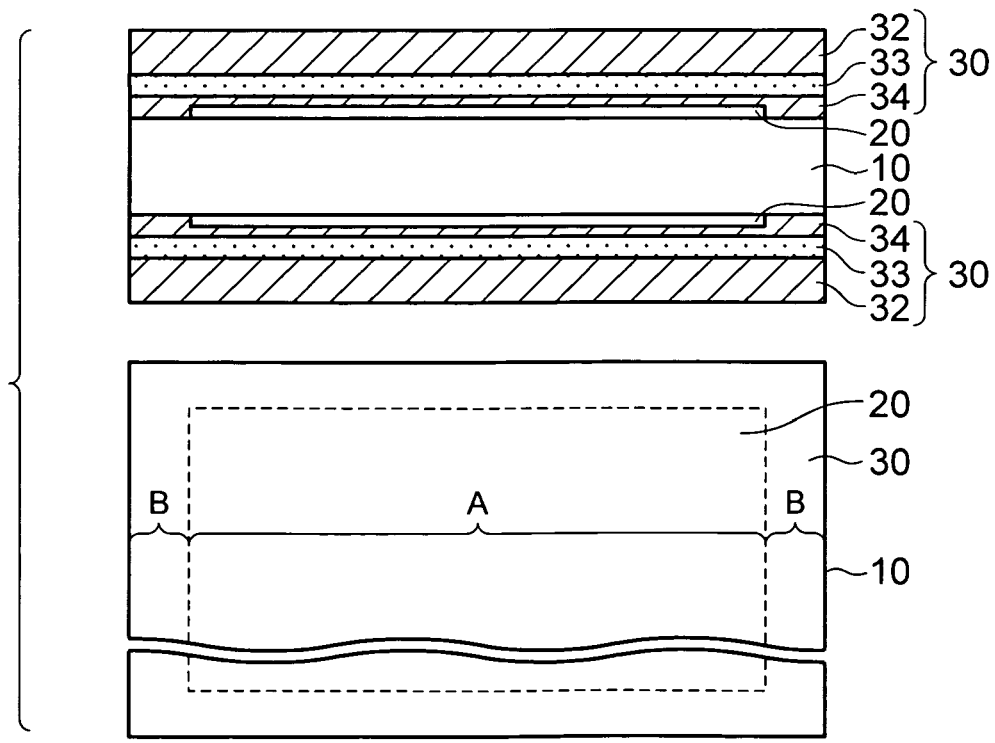

Then, as shown in FIG. 5C, like the first embodiment, the prepreg 10a is cured by the heating/pressurizing such that the temporary substrate 10 is formed and also the underlying layer 20 and the outer peripheral portion of the peelable multi-layer copper foil 30 are adhered to the temporary substrate 10. In this case, like FIG. 1D in the first embodiment, the underlying layer 20 and the peelable multi-layer copper foil 30 may be adhered to the temporary substrate 10 by using the adhesive layer.

Figure 5D:
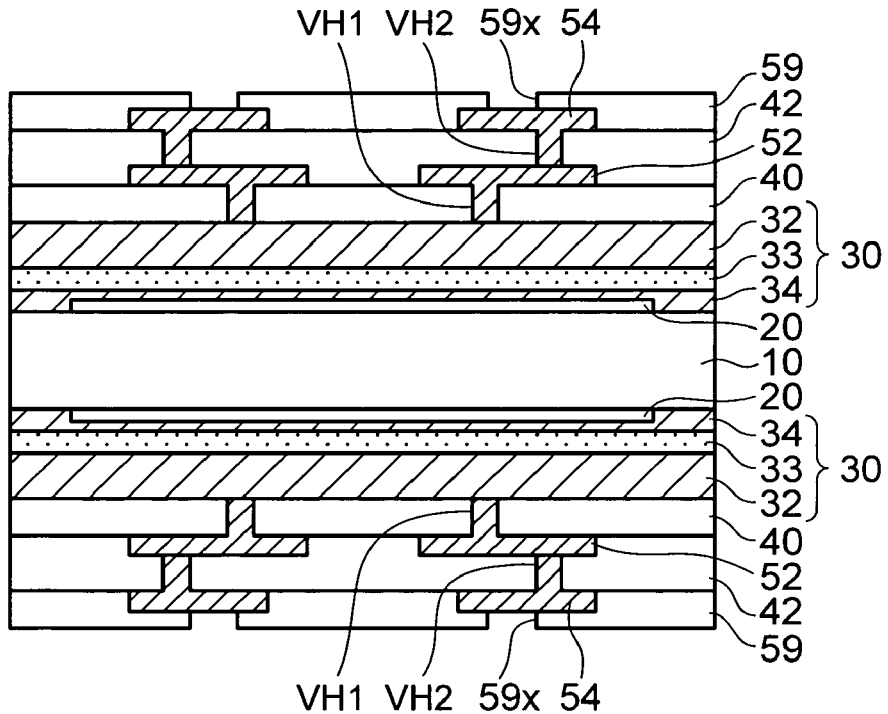

Then, as shown in FIG. 5D, the built-up wiring layer (the second and third wiring layers 52, 54, the first and second interlayer insulating layers 40, 42, and the solder resist 59) is formed on the peelable multi-layer copper foil 30 on both surface sides of the temporary substrate 10 by the similar method to the first embodiment respectively.

Figure 5E:
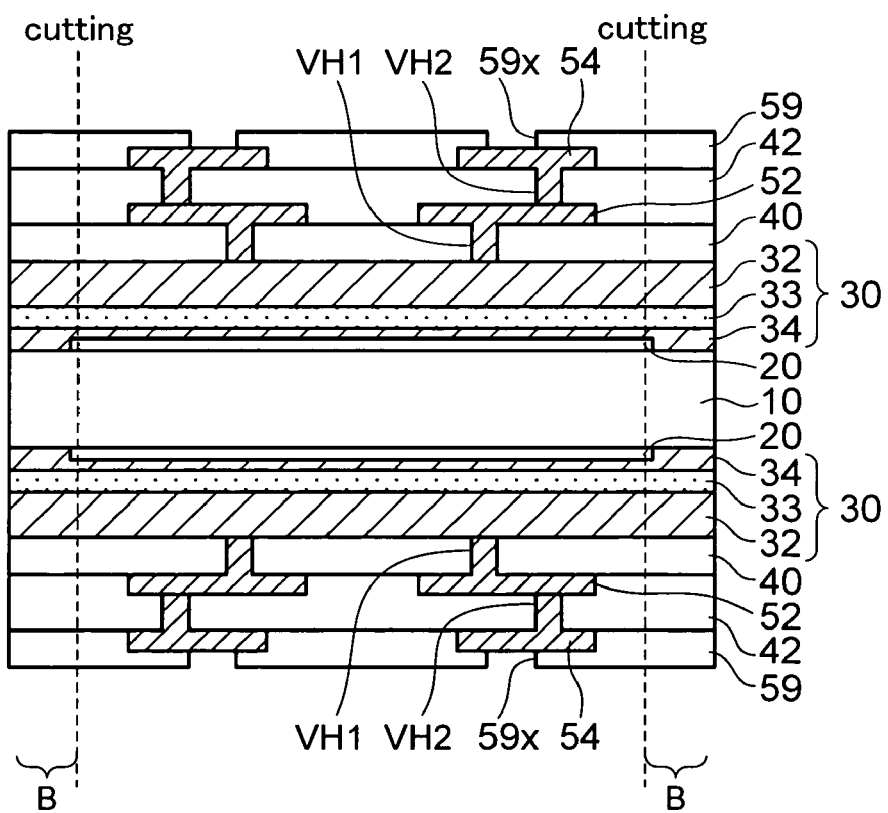
Figure 5F:
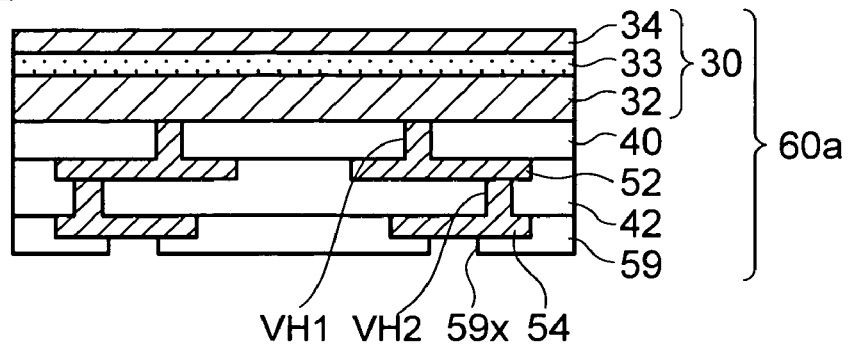

Then, as shown in FIG. 5E, the outer peripheral portion B containing the peripheral portion of the peelable multi-layer copper foil 30 is removed by cutting the portion of the structure in FIG. 5D corresponding to the periphery of the underlying layer 20. Thus, as shown in FIG. 5F, a wiring member 60a in which the built-up wiring layer is formed on the peelable multi-layer copper foil 30 is obtained from both surface sides of the temporary substrate 10 respectively. In the wiring member 60a of the second embodiment, the first copper foil 32 is connected to the second wiring layer 52.

Figure 5G:
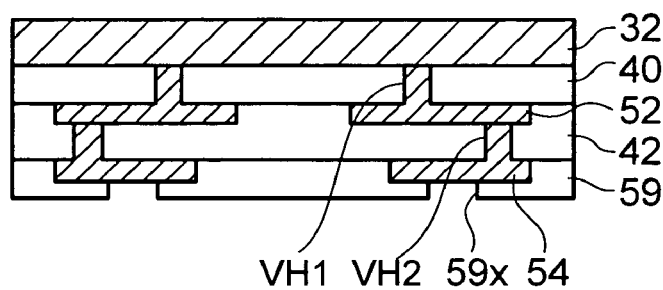

Then, as shown in FIG. 5G, the second copper foil 34 as well as the peelable layer 33 is peeled from the wiring member 60a in FIG. 5F to expose the first copper foil 32.

Figure 5H:
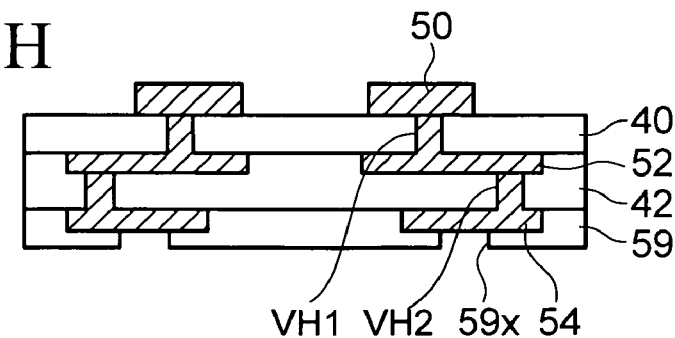

Then, as shown in FIG. 5H, a resist (not shown) is patterned on the first copper foil 32, then the first copper foil 32 is etched by using the resist as a mask, and then the resist is removed. Thus, the first wiring layer 50 connected to the second wiring layer 52 is formed on the first interlayer insulating layer 40.

Figure 5I:
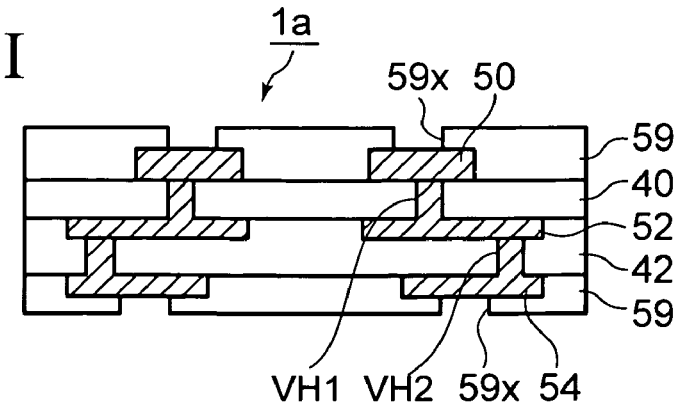

Then, as shown in FIG. 5I, like the first embodiment, the solder resist 59 in which the opening portions 59x are provided on the connection portions of the first wiring layers 50 is formed.

With the above, a wiring substrate 1a of the second embodiment is manufactured. In the manufacturing method of the second embodiment, like the first embodiment, the peelable multi-layer copper foil 30 (in a vertically reversed state from the first embodiment) containing the first copper foil 32 acting as the supporting plate upon separating the wiring member 60a from the temporary substrate 10 exists in the wiring member 60. Therefore, the wiring member 60a can be separated from the temporary substrate 10 with high manufacturing yield and good reliability.

Also, in the second embodiment, the thick first copper foil 32 that is easily applicable to the wiring layer and is connected to the second wiring layer 52 is left by removing the second copper foil 34 of the peelable multi-layer copper foil 30. As a result, the first wiring layer 50 connected to the second wiring layer 52 can be formed by simply patterning the first copper foil 32, and also the wiring substrate can be manufactured in a shorter time than the first embodiment.

Like the first embodiment, in the wiring substrate 1a of the second embodiment, the semiconductor chip is flip-chip connected to either of the uppermost wiring layer and the lowermost wiring layer, and the external connection terminals are provided to the wiring layer on the opposite side.

Third Embodiment

FIGS. 6A to 6G are sectional views showing a method of manufacturing an electronic component device according to a third embodiment of the present invention.

In the first and second embodiments, the mode in which the electronic component is mounted after individual wiring substrates are obtained is explained. In the third embodiment, in order to avoid the influence of a bowing in mounting the electronic component as much as possible, the electronic component is mounted in a state that the temporary substrate or the peelable multi-layer copper foil is still left under the built-up wiring layer.

Figure 6A:
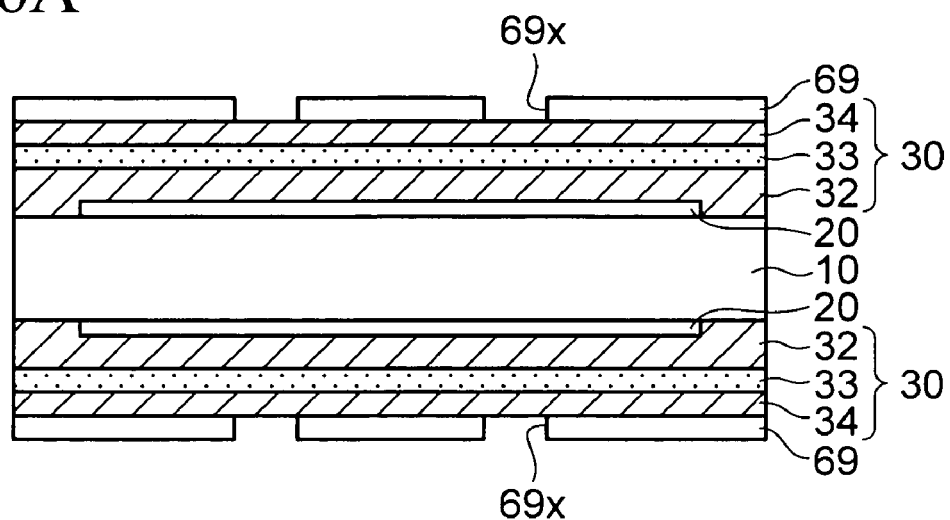
FIGS. 6A to 6G are sectional views showing a method of manufacturing an electronic component device according to a third embodiment of the present invention.
Figure 6B:
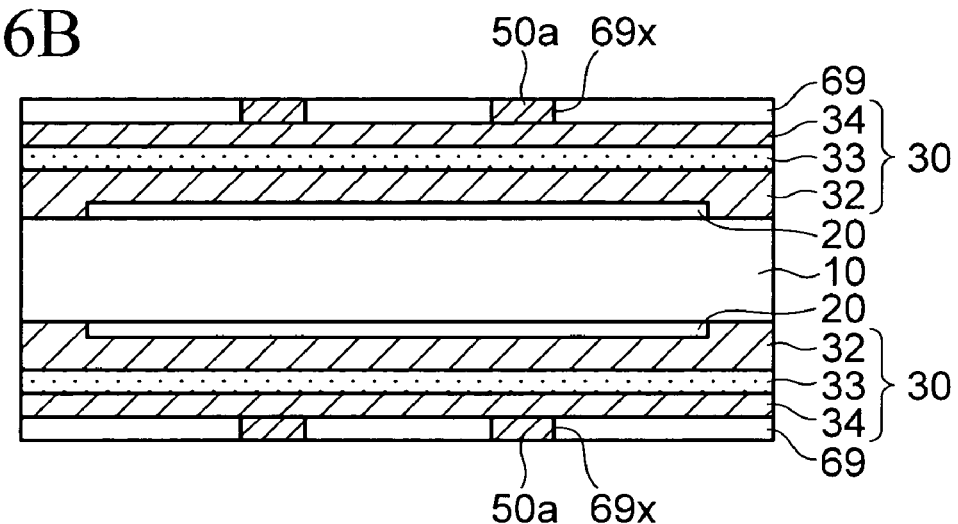

As shown in FIG. 6A, first, the structure in which the underlying layer 20 and the peelable multi-layer copper foil 30 larger in size than this underlying layer are adhered is obtained on both surfaces sides of the temporary substrate 10 by the similar method to the first embodiment. Then, as shown in FIG. 6B, a solder resist 69 in which opening portions 69x are provided is formed on the peelable multi-layer copper foil 30 on both surfaces sides of the temporary substrate 10 respectively. In place of the solder resist 69, an insulating layer in which opening portions are provided may be formed with the similar resin to the first interlayer insulating layer 40 of the first embodiment.

Then, pad-like first wiring layers 50a are obtained by forming a metal layer in the opening portions 69x by the electroplating using the peelable multi-layer copper foil 30 as the plating power feeding path. The first wiring layer 50a is formed of gold (Au), nickel (Ni), tin (Sn), or the like. Alternately, the first wiring layers 50a may be formed by forming a laminated film, which is formed of a gold layer/a nickel layer, a gold layer/a palladium (Pd) layer/a nickel layer, or the like sequentially from the lower side, by the plating. In the third embodiment, the first wiring layer 50a is utilized as the external connection electrode.

Figure 6C:
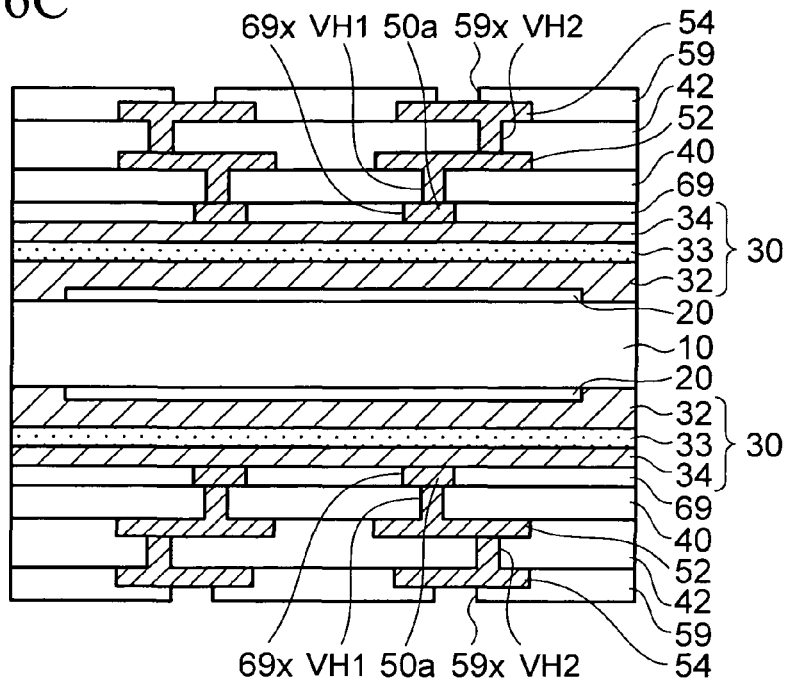

Then, as shown in FIG. 6C, the built-up wiring layer (the second and third wiring layers 52, 54, the first and second interlayer insulating layers 40, 42, and the solder resist 59) connected to the first wiring layers 50a is formed on the first wiring layers 50a on both surface sides of the temporary substrate 10 by the similar method to the first embodiment. Thus, the external connection terminals (the first wiring layers 50a) are provided to the lowermost side of the built-up wiring layer.

Figure 6D:
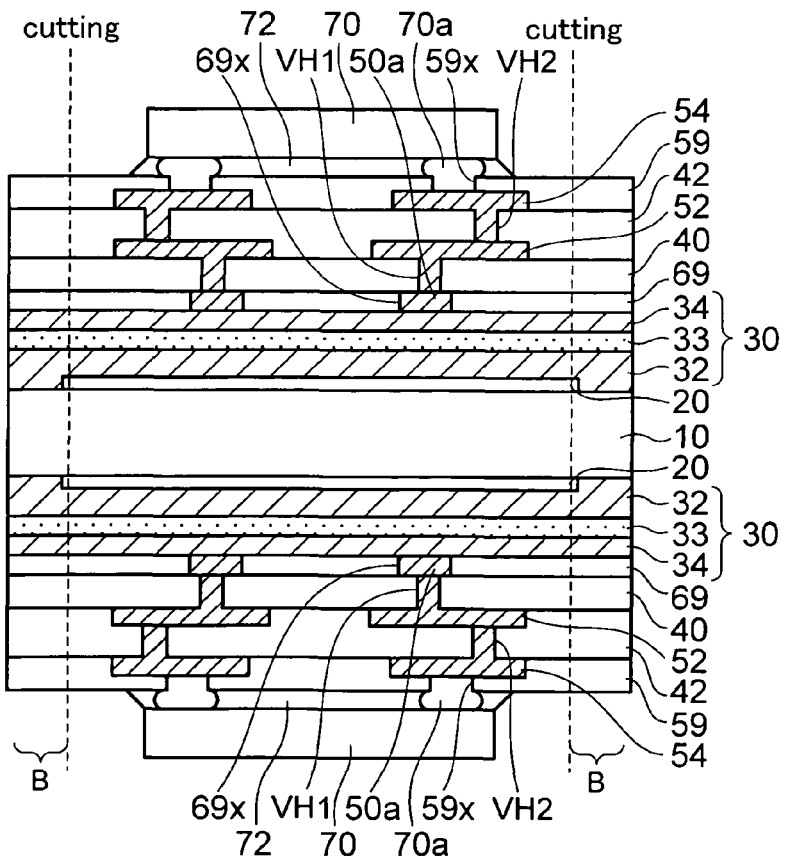

Then, as shown in FIG. 6D, the bumps 70a of the semiconductor chip 70 are flip-chip connected to the connection portions of the third wiring layers 54 on both surface sides of the temporary substrate 10. At this time, because the temporary substrate 10 exists under the built-up wiring layer, the structure is hardly influenced by the bowing, so that the conveyance and the handling are made easy and thus the semiconductor chip 70 can be mounted with good reliability. Then, the underfill resin 72 is filled in the clearance under the semiconductor chip 70.

Then, the outer peripheral portion B is removed by cutting the portion of the structure in FIG. 6D corresponding to the periphery of the underlying layer 20.

Figure 6E:
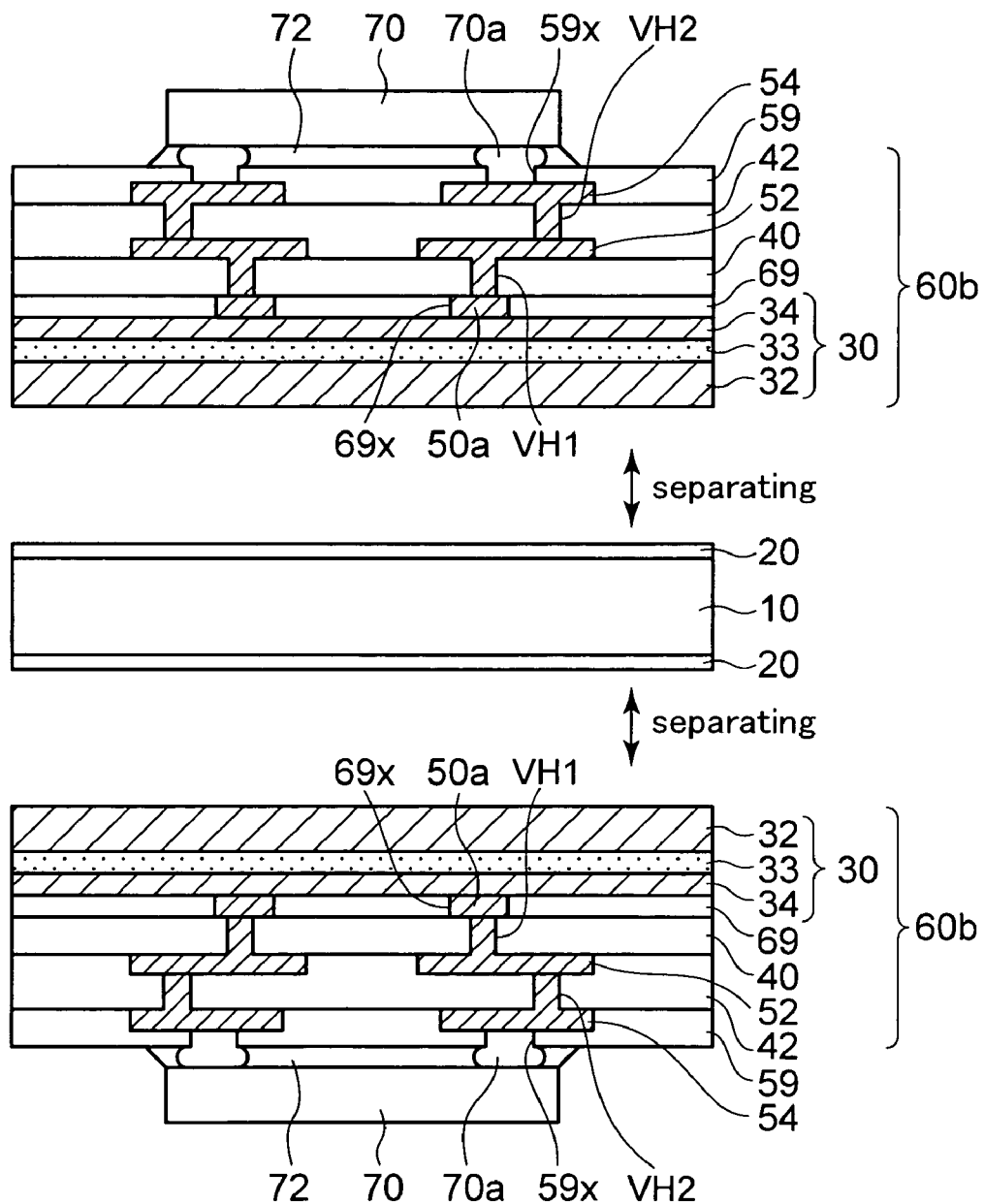
Figure 6F:
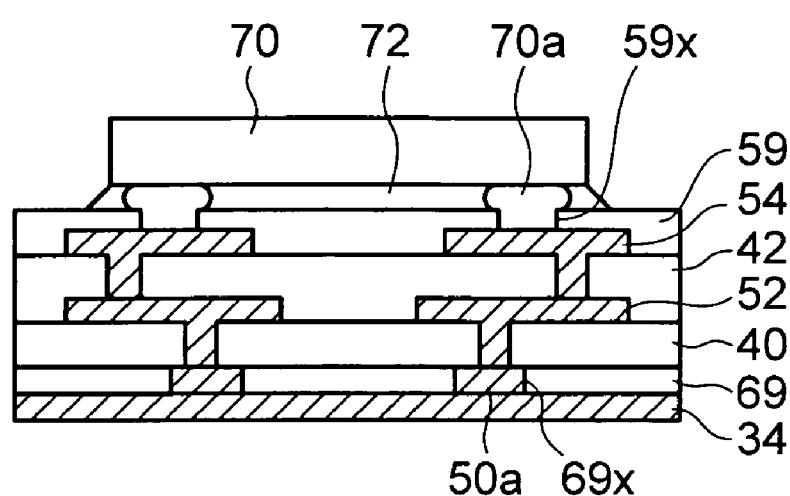

Thus, as shown in FIG. 6E, the structure in which the semiconductor chip 70 is mounted on a wiring member 60b in which the built-up wiring layer is formed on the peelable multi-layer copper foil 30, is separated from both surface sides of the temporary substrate 10. Then, as shown in FIG.

6F, the first copper foil 32 as well as the peelable layer 33 is peeled from the structure in FIG. 6E to expose the second copper foil 34.

Then, the second copper foil 34 is removed selectively with respect to the first wiring layer 50a (the gold pad, or the like) and the solder resist 69 by the wet etching using an iron (III) chloride aqueous solution, a copper (II) chloride aqueous solution, an ammonium peroxodisulfate aqueous solution, or the like. Thus, as shown in FIG. 6G, the lower surfaces of the first wiring layers 50a are exposed to constitute external connection electrodes C, and thus an electronic component device 2a of the present embodiment is manufactured.

Figure 6G:
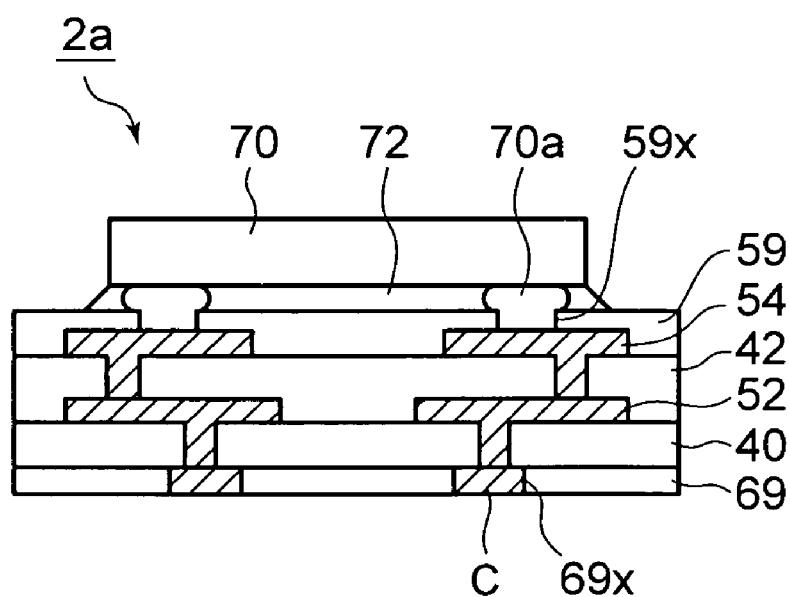

In FIG. 6G, an example in which the external connection type is used as the LGA (Land Grid Array) type is shown, and the external connection electrode C is used as the land. When the external connection type is used as the BGA (Ball Grid Array) type, the external connection terminals are provided by mounting the solder balls, or the like on the external connection electrodes C respectively. Also, when the external connection type is used as the PGA (Pin Grid Array) type, the lead pin is provided to the external connection electrodes C.

Figure 7A:
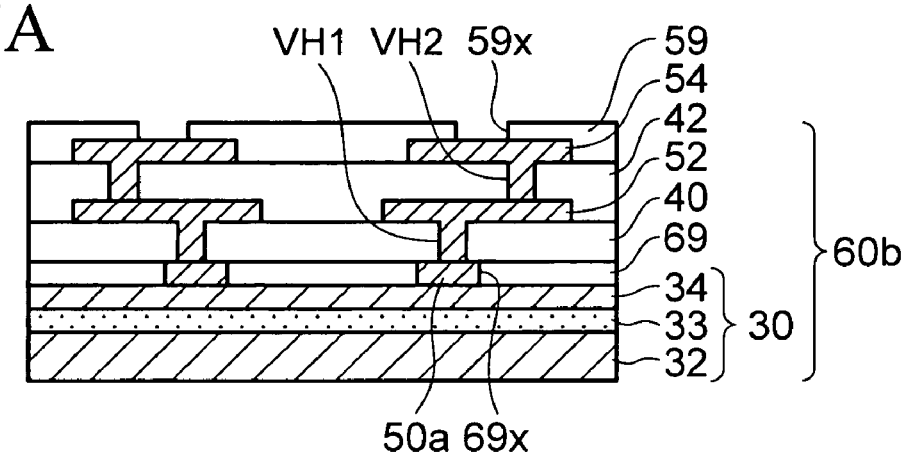
FIGS. 7A to 7C are sectional views showing a method of manufacturing an electronic component device according to a variation of the third embodiment of the present invention.
Figure 7B:
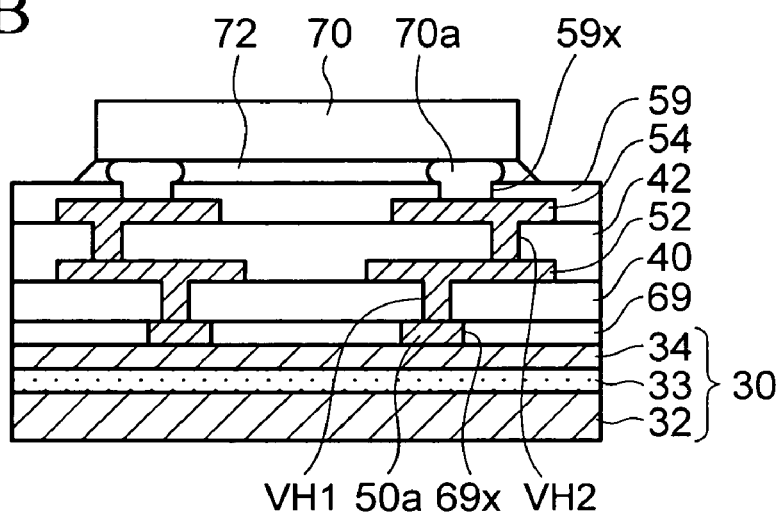
Figure 7C:
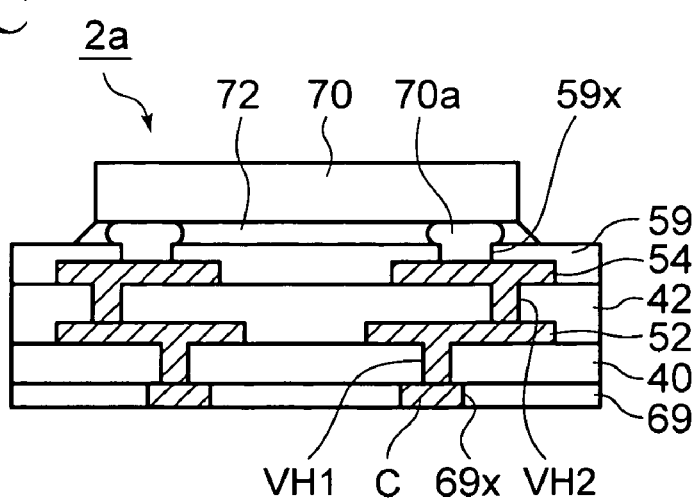

As a variation of the third embodiment, as shown in FIG. 7A, the wiring member 60b is separated from the temporary substrate 10 not to mount the semiconductor chip 70 in the above step in FIG. 6D. Then, as shown in FIG. 7B, the semiconductor chip 70 is flip-chip connected to the third wiring layer 54 of the wiring member 60b, and the underfill resin 72 is filled in the lower clearance. Then, as shown in FIG. 7C, similarly the lower surfaces of the first wiring layers 50a are exposed by removing the peelable multi-layer copper foil 30 to obtain the external connection electrodes C. As a result, the electronic component device 2a is manufactured.

In the case of this variation, the peelable multi-layer copper foil 30 serving as the supporting plate exists in the wiring member 60b upon mounting the semiconductor chip 70. Therefore, similarly the structure is hardly influenced by the bowing, and the semiconductor chip 70 can be mounted with good reliability.

In the third embodiment, the preferred method as the mode in which the semiconductor chip 70 is mounted in such a situation that the temporary substrate 10 or the peelable multi-layer copper foil 30 is still left is explained. Also, in the first and second embodiments, the semiconductor chip 70 may be mounted in such a situation that the temporary substrate 10 or the peelable multi-layer copper foil 30 is still left (after the step in FIG. 1G or FIG. 1I in the first embodiment, or after the step in FIG. 5D or FIG. 5F in the second embodiment). Then, the wiring layer may be formed by utilizing the first copper foil 32 or the second copper foil 34 by executing the similar steps.

Figure 8A:
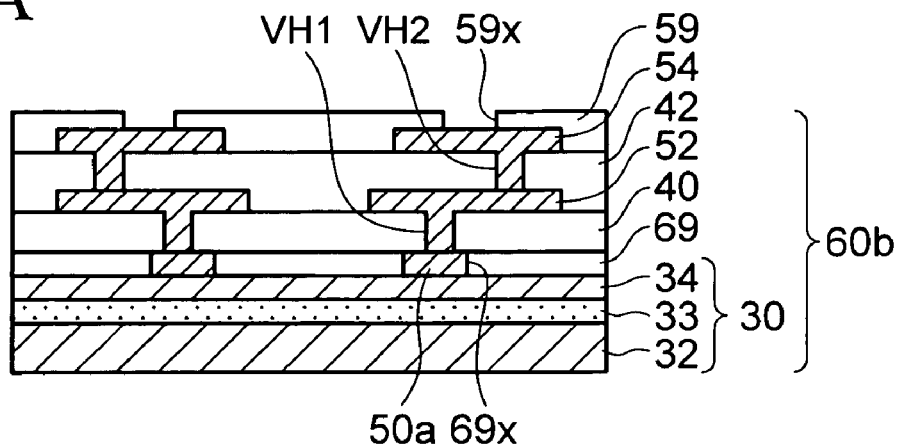
FIGS. 8A to 8C are sectional views showing a method of obtaining a wiring substrate by utilizing the method of manufacturing the electronic component device according to the third embodiment of the present invention.

Also, the wiring substrate may be formed by utilizing the manufacturing method of the third embodiment. That is, as shown in FIG. 8A, first, the wiring member 60b is obtained by cutting the portion of the structure in FIG. 6C corresponding to the periphery of the underlying layer 20 in the condition that the semiconductor chip 70 is not mounted after the above step in FIG. 6C.

Figure 8B:
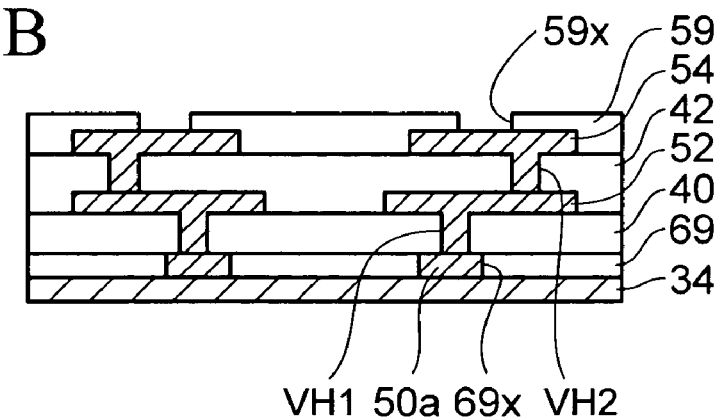
Figure 8C:
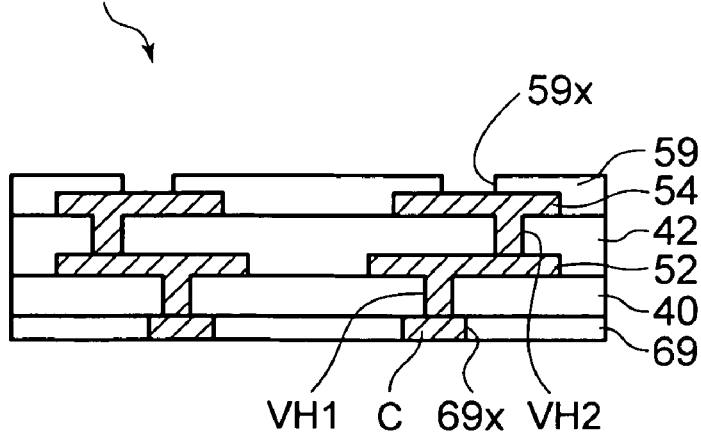

Then, as shown in FIG. 8B, the first copper foil 32 as well as the peelable layer 33 is peeled to expose the second copper foil 34. Then, as shown in FIG. 8C, the lower surfaces of the first wiring layers 50a are exposed by removing the second copper foil 34 to obtain the external connection electrodes C. Thus, a wiring substrate 1b is obtained.

When such manufacturing method is applied, the wiring substrate 1b provided with the external connection electrodes C can be obtained only by removing the thin second copper foil 34 after the wiring member 60b is obtained. As a result, the removing process of the copper foil can be executed in a short time, productivity of the wiring substrate can be improved, and also the damage on the wiring substrate can be reduced.

In this case, the external connection electrode C may be used as the terminal for mounting the chip, and the third wiring layer 54 may be used as the external connection terminal.

What is claimed is:

1. A method of manufacturing a wiring substrate, comprising the steps of:

obtaining a structure in which an underlying layer is arranged in a wiring forming area of a temporary substrate, and a peelable multi-layer metal foil that is larger in size than the underlying layer is arranged on the underlying layer and is adhered partially to an outer peripheral portion of the wiring forming area of the temporary substrate, the peelable multi-layer metal foil constructed by temporary adhering a first metal foil and a second metal foil with peelable adhesive layer;

forming a built-up wiring layer on the peelable multi-layer metal foil; and separating the peelable multi-layer metal foil from the temporary substrate, by cutting a portion of a structure in which the underlying layer, the peelable multi-layer metal foil, and the built-up wiring layer are formed on the temporary substrate, the portion corresponding to a peripheral portion the underlying layer, to obtain a wiring member in which the built-up wiring layer is formed on the peelable multi-layer metal foil.

2. A method of manufacturing the wiring substrate according to claim 1, wherein, in the step of obtaining the structure in which the underlying layer and the peelable multi-layer metal foil are adhered on the temporary substrate, the underlying layer and the peelable multi-layer metal foil are stacked and arranged on a semi-cured prepreg, and then the prepreg is cured by heating and pressurizing to form the temporary substrate and to adhere the temporary substrate to the underlying layer and the peelable multi-layer metal foil.

3. A method of manufacturing the wiring substrate according to claim 1, wherein a film thickness of the first metal foil is set thicker than a film thickness of the second metal foil, and the peelable multi-layer metal foil is adhered to the temporary substrate such that the first metal foil is contacted a side of the temporary substrate, and after the step of obtaining the wiring member, further comprising the steps of:

exposing the second metal foil by peeling the first metal foil; and forming a wiring layer connected to the built-up wiring layer by utilizing the second metal foil.

4. A method of manufacturing the wiring substrate according to claim 3, wherein the step of obtaining the wiring layer connected to the built-up wiring layer includes the steps of:

forming a resist in which opening portions are formed on the second metal foil, forming a metal pattern layer in the opening portions by an electroplating utilizing the second metal foil as a plating power feeding path, removing the resist, and etching the second metal foil by using the metal pattern layer as a mask to remove portions of the second metal foil not covered by the mask.

5. A method of manufacturing the wiring substrate according to claim 3, wherein the step of obtaining the wiring layer connected to the built-up wiring layer includes obtaining the wiring layer by patterning the second metal foil.

6. A method of manufacturing the wiring substrate according to claim 3, wherein the step of obtaining the wiring layer connected to the built-up wiring layer includes the steps of:
forming a metal plating layer on the second metal foil; and
obtaining the wiring layer by patterning the metal plating layer and the second metal foil.

7. A method of manufacturing the wiring substrate according to claim 1, wherein a film thickness of the first metal foil is set thicker than a film thickness of the second metal foil, and the peelable multi-layer metal foil is adhered to the temporary substrate such that the first metal foil is faced to contacted a side of the temporary substrate, and connection electrodes are provided to a lowermost side of the built-up wiring layer, and
after the step of obtaining the wiring member, further comprising the steps of:
exposing the second metal foil by peeling the first metal foil; and
exposing connection electrodes of the built-up wiring layer by removing the second metal foil by etching.

8. A method of manufacturing the wiring substrate according to claim 1, wherein a film thickness of the first metal foil is set thicker than a film thickness of the second metal foil, and the peelable multi-layer metal foil is adhered to the temporary substrate such that the second metal foil is contacted a side of the temporary substrate, and
after the step of obtaining the wiring member, further comprising the steps of:
exposing the first metal foil by peeling the second metal foil; and
obtaining a wiring layer connected to the built-up wiring layer, by patterning the first metal foil.

9. A method of manufacturing the wiring substrate according to claim 1, wherein the underlying layer is formed of a metal foil, a release film, or a release agent.

10. A method of manufacturing an electronic component device, comprising the steps of:
obtaining the wiring substrate by the manufacturing method set forth in any one of claims 3 to 9; and
mounting an electronic component to the wiring substrate by connecting the electronic component to an uppermost or lowermost wiring layer of the wiring substrate.

11. A method of manufacturing an electronic component device, comprising the steps of:
obtaining a structure in which an underlying layer is arranged in a wiring forming area of a temporary substrate, and a peelable multi-layer metal foil that is larger in size than the underlying layer is arranged on the underlying layer and is adhered partially to an outer peripheral portion of the wiring forming area of the temporary substrate, the peelable multi-layer metal foil constructed by temporary adhering a first metal foil and a second metal foil with peelable adhesive layer;
forming a built-up wiring layer on the peelable multi-layer metal foil;
separating the peelable multi-layer metal foil from the temporary substrate, by cutting a portion of a structure in which the underlying layer, the peelable multi-layer metal foil, and the built-up wiring layer are formed on the temporary substrate, the portion corresponding to a peripheral portion the underlying layer, obtain a wiring member in which the built-up wiring layer is formed on the peelable multi-layer metal foil; and
mounting an electronic component to the wiring substrate by connecting the electronic component to an uppermost wiring layer of the built-up wiring layer, after the step of forming the built-up wiring layer or after the step of obtaining the wiring member.

12. A method of manufacturing the electronic component device according to claim 11, wherein a film thickness of the first metal foil is set thicker than a film thickness of the second metal foil, and the peelable multi-layer metal foil is adhered to the temporary substrate such that the first metal foil is contacted a side of the temporary substrate, and
after the step of obtaining the wiring member on which the electronic component is mounted, further comprising the steps of:
exposing the second metal foil by peeling the first metal foil; and
forming a wiring layer connected to the built-up wiring layer by utilizing the second metal foil.

13. A method of manufacturing the electronic component device according to claim 12, wherein the step of obtaining the wiring layer connected to the built-up wiring layer includes the steps of:
forming a resist in which opening portions are formed on the second metal foil,
forming a metal pattern layer in the opening portions by an electroplating utilizing the second metal foil as a plating power feeding path,
removing the resist, and
etching the second metal foil by using the metal pattern layer as a mask to remove portions of the second metal foil not covered by the mask.

14. A method of manufacturing the electronic component device according to claim 12, wherein the step of obtaining the wiring layer connected to the built-up wiring layer includes obtaining the wiring layer by patterning the second metal foil.

15. A method of manufacturing the electronic component device according to claim 12, wherein the step of obtaining the wiring layer connected to the built-up wiring layer includes the steps of:
forming a metal plating layer on the second metal foil; and
obtaining the wiring layer by patterning the metal plating layer and the second metal foil.

16. A method of manufacturing the electronic component device according to claim 11, wherein connection electrodes are provided to a lowermost side of the built-up wiring layer, and
after the step of obtaining the wiring member on which the electronic component is mounted, further comprising the step of removing the peelable multi-layer metal foil from the wiring member on which the electronic component is mounted; and
wherein the connection electrodes are exposed in the step of removing the peelable multi-layer metal foil.

17. A method of manufacturing the electronic component device according to claim 11, wherein the electronic component is a semiconductor chip, and the semiconductor chip is flip-chip connected to the wiring layer.

* * * * *